United States Patent
Hibi

(10) Patent No.: US 6,358,817 B1
(45) Date of Patent: Mar. 19, 2002

(54) SEMICONDUCTOR STORAGE UNIT AND METHOD OF MANUFACTURING THE SAME

(75) Inventor: Toshitaka Hibi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/205,133

(22) Filed: Dec. 3, 1998

(30) Foreign Application Priority Data

Dec. 9, 1997 (JP) .............................................. 9-339073

(51) Int. Cl.[7] .............................................. H01L 21/76
(52) U.S. Cl. ...................... 438/430; 438/289; 438/282; 438/291; 438/427; 438/589
(58) Field of Search ................ 438/589, 430, 438/291, 282, 427, 289

(56) References Cited

U.S. PATENT DOCUMENTS

| | | | |
|---|---|---|---|
| 4,685,196 A | * 8/1987 | Lee | 437/41 |
| 5,371,024 A | * 12/1994 | Hieda et al. | 437/40 |
| 5,398,205 A | 3/1995 | Yamaguchi | |
| 5,463,236 A | 10/1995 | Sakao | |
| 5,472,894 A | * 12/1995 | Hsu et al. | 437/44 |
| 5,923,980 A | * 7/1999 | Gardner et al. | 438/270 |
| 6,100,146 A | * 8/2000 | Gardner et al. | 438/301 |
| 6,171,916 B1 | * 1/2001 | Sugawara et al. | 438/303 |

FOREIGN PATENT DOCUMENTS

| | | |
|---|---|---|
| JP | 3-006060 | 1/1991 |
| JP | 3-142971 | 6/1991 |

* cited by examiner

*Primary Examiner*—Eddie Lee
*Assistant Examiner*—N. Drew Richards
(74) *Attorney, Agent, or Firm*—Merchant & Gould PC

(57) ABSTRACT

A semiconductor storage unit and a method of manufacturing the same are provided. In the semiconductor storage unit, the formation of a gate electrode within a semiconductor substrate decreases the occurrence of a short circuit between conductive layers, provides an excellent electric connection in a connection hole between the semiconductor substrate and a conductive layers, and also reduces the number of manufacturing processes. In a semiconductor substrate, unit memory cells and are formed by providing a gate electrode in a region where a second opening is formed in a first opening, a first impurity-diffusion layer, a second impurity-diffusion layer, a third impurity-diffusion layer, a bit line, a charge-storage electrode, a capacity insulating film, and a plate electrode. Regions where the second opening is not formed are isolation regions and between memory cells. Consequently, a short circuit between the gate electrode and the other conductive layers does not occur easily and connection holes and can be made shallower, thus obtaining an excellent electric connection inside the connection holes.

16 Claims, 23 Drawing Sheets

SEMICONDUCTOR STORAGE UNIT AND METHOD OF MANUFACTURING THE SAME

FIELD OF THE INVENTION

The present invention relates to a semiconductor storage unit and a method of manufacturing the same.

BACKGROUND OF THE INVENTION

Recently, a semiconductor storage unit has been highly integrated and each element included in the semiconductor storage unit has a minute size. Consequently, the elements are arranged quite closely. For instance, in manufacturing processes for DRAM having a general stack-type memory cell structure, an active region, an element- isolation region, a word line (a gate electrode), a bit line, and a memory cell capacitor are formed on a semiconductor substrate sequentially. A method of manufacturing a conventional semiconductor storage unit will be explained with reference to FIGS. 20–23 as an example of a manufacturing process for DRAM having a stack-type memory cell structure as follows.

First, in processes shown in FIGS. 20(a) and (b), a laminated film 302 of a silicon nitride film and a silicon oxide film is formed on a semiconductor substrate 301, and using a photoresist 303 a part of the laminated film 304 and a part of the semiconductor substrate 305 are removed by photoetching, thus forming grooves 306.

As next steps, in processes shown in FIGS. 20(c), (d), and (e), after depositing a CVD silicon oxide film 307, a part of the laminated film 304 and a part of the silicon oxide film 307 are removed by polishing to flatten the whole surface and to leave a filled-in film 310 within the grooves 309. Then, the whole laminated film 308 and a part of the filled-in film 310 are removed by wet etching to leave the filled-in film 311 and to expose a surface 312 of the semiconductor substrate.

In processes shown in FIGS. 21(a) and (b), a gate oxide film 313 and a polysilicon film 314 containing impurities are formed sequentially, and then a gate electrode (a word line) 316 is formed by photoetching using a photoresist 315. As a next step, in a process shown in FIG. 21(c), an impurity-diffusion layer 318 is formed by ion implantation 317.

In processes shown in FIG. 21(d) and FIG. 22(a), a CVD silicon oxide film 319 is deposited and flattened, and then a contact hole 321 is formed by photoetching using a photoresist 320. As a next step, in a process shown in FIG. 22(b), after depositing a laminated film 322 of a tungsten silicide film and a polysilicon film containing impurities, a bit line 322 is formed by photoetching.

In processes shown in FIGS. 22(c) and (d), a CVD silicon oxide film 323 is deposited and flattened, and then a contact hole 325 is formed by photoetching using a photoresist 324. As next steps, in processes shown in FIGS. 23(a) and (b), a polysilicon film 326 containing impurities is deposited and a charge-storage electrode 328 is formed by photoetching using a photoresist 327.

Then, in a process shown in FIG. 23(c), a capacity insulating film 329 formed of a laminated film of a silicon oxide film and a silicon nitride film and a polysilicon film 330 containing impurities are formed sequentially, and a plate electrode 330 is then formed by photoetching.

However, in the conventional semiconductor storage unit described above, all the conductive layers of the gate electrode 316, the bit line 322, the charge-storage electrode 328, and the plate electrode 330 are provided on the semiconductor substrate. Therefore, there has been a possibility that a short-circuit occurs easily between the conductive layers when the width of an isolation region between elements and the thickness of an insulating film are decreased according to the higher integration.

Further, in order to secure the insulation between upper and lower conductive layers, it is necessary to increase the thickness of an insulating film between the upper and lower conductive layers. Consequently, the depth of a connection hole for connecting a conductive layer of an upper layer and the semiconductor substrate is increased and therefore the aspect ratio increases, thus deteriorating the covering condition inside the connection hole in the conductive layers. As a result, there has been a problem that poor electric connection occurs inside the connection hole.

SUMMARY OF THE INVENTION

The present invention aims to solve the problems described above. It is an object of the present invention to provide a semiconductor storage unit at a low manufacturing cost by reducing the number of manufacturing processes, in which the formation of a gate electrode within a semiconductor substrate reduces the occurrence of a short circuit between conductive layers and therefore provides an excellent electric connection in a connection hole between the semiconductor substrate and conductive layers, and a method of manufacturing the same.

In order to attain the object described above, a semiconductor storage unit of the present invention comprises a semiconductor substrate, an impurity-diffusion layer, an insulating film, a bit line of a conductive film, a charge-storage electrode of a conductive film, and a gate electrode of a conductive film, which are formed on the semiconductor substrate. The impurity-diffusion layer has a reverse conductive type as compared to that of the semiconductor substrate and is formed on the semiconductor substrate. In the semiconductor storage unit, the bit line and the charge-storage electrode are connected to the surface of the semiconductor substrate. A plurality of openings are formed in the semiconductor substrate. A filled-in layer of an insulating film is formed within the openings and the gate electrode is formed within the filled-in layer.

According to the semiconductor storage unit described above, the gate electrode is provided within the semiconductor substrate. Therefore, the short-circuit between the gate electrode and the other conductive layers does not occur easily, thus improving the reliability of the semiconductor storage unit. Since the depth of a connection hole for connecting the semiconductor substrate and the conductive layers located above the gate electrode can be made shallow, an excellent covering condition inside the connection hole can be obtained in the conductive layers. Consequently, poor electric connection of the conductive layers can be prevented in the connection hole, thus improving the reliability of the semiconductor storage unit.

In the semiconductor storage unit described above, it is preferable that the bit line and the surface of the semiconductor substrate are connected through a connection hole that is formed by making an opening in the insulating film and that opens between the bit line and the surface of the semiconductor substrate, and the charge-storage electrode and the surface of the semiconductor substrate are connected through a connection hole that is formed by making an opening in the insulating film and that opens between the charge-storage electrode and the surface of the semiconductor substrate.

It is preferable that an insulating film is formed between a bottom face of the opening and the gate electrode.

Further, it is preferable that a plate electrode of a conductive film is formed on the charge-storage electrode and the insulating film via a capacity insulating film.

It is also preferable that the bit line is formed between the semiconductor substrate and the plate electrode.

It is preferable that the bit line is formed on the plate electrode via an insulating film.

It is further preferable that the connection hole for connecting the bit line and the semiconductor substrate passes through between the adjacent plate electrodes. According to the semiconductor storage unit described above, the connection hole is secured within a pattern of the plate electrode, thus enabling the semiconductor storage unit to be highly integrated.

It is preferable that the depth of the opening is deeper than that of the impurity-diffusion layer. According to the semiconductor storage unit described above, reliable insulation can be obtained between memory cells having a switching transistor provided with a gate electrode within the semiconductor substrate.

It is also preferable that the openings described above include openings in which the gate electrode is formed and openings in which the gate electrode is not formed, and in the openings in which the gate electrode is formed, besides the impurity-diffusion layer described above, a second impurity-diffusion layer having a reverse conductive type as compared to that of the semiconductor substrate is formed.

It is preferable that an impurity-diffusion layer having the same conductive type as that of the semiconductor substrate is formed in the openings in which the gate electrode is formed and isolates the second impurity-diffusion layer having a reverse conductive type as compared to that of the semiconductor substrate formed besides the former impurity-diffusion layer. According to the semiconductor storage unit described above, threshold voltage control of a switching transistor of a memory cell can be performed securely. That is to say, even in the case of miniaturizing a semiconductor storage unit, when the impurity-diffusion layer having a reverse conductive type as compared to that of the semiconductor substrate is isolated by the impurity-diffusion layer having the same conductive type as that of the semiconductor substrate and these isolated impurity-diffusion layers are used as a source and a drain, the on-off control of the switching transistor can be performed at the gate electrodes.

It is further preferable that the depth of the impurity-diffusion layer having the same conductive type as that of the semiconductor substrate is deeper than that of the second impurity-diffusion layer having a reverse conductive type as compared to that of the semiconductor substrate. According to the semiconductor storage unit described above, the impurity-diffusion layer having a reverse conductive type as compared to that of the semiconductor substrate can be isolated securely by the impurity-diffusion layer having the same conductive type as that of the semiconductor substrate.

It is preferable that the two impurity-diffusion layers having a reverse conductive type as compared to that of the semiconductor substrate described above are a source and a drain of a switching transistor of a memory cell, the gate electrode is a gate electrode of the switching transistor of a memory cell, and the insulating filed-in layer formed at the opening having no gate electrode is an element-isolation region. According to the semiconductor storage unit described above, the depth of the connection hole for connecting the bit line and the semiconductor substrate and the depth of the connection hole for connecting the charge-storage electrode and the semiconductor substrate are shallow. Therefore, an excellent condition for covering the materials of the bit line and the charge-storage electrode can be obtained inside the connection holes and poor electric connection inside the connection holes can be prevented, thus improving the reliability of the semiconductor storage unit.

A method of manufacturing a semiconductor storage unit of the present invention comprises: forming a first impurity-diffusion layer on a semiconductor substrate, the first impurity-diffusion layer having a reverse conductive type as compared to that of the semiconductor substrate; forming a first insulating film on the semiconductor substrate and then a plurality of first openings with a groove shape by partially removing the first insulating film and the semiconductor substrate by photoetching; forming a filled-in layer in the first openings by depositing a second insulating film on the semiconductor substrate; flattening the first and second insulating films on the semiconductor substrate; forming second openings by partially removing the filled-in layer in specific first openings selected from the plurality of first openings by photoetching; depositing a third insulating film in the second openings and a first conductive film on the semiconductor substrate sequentially; and forming a gate electrode within the second opening via the third insulating film by leaving the first conductive film in the second openings.

According to the method of manufacturing a semiconductor storage unit described above, the gate electrode is formed within the semiconductor substrate. Therefore, the short circuit between the gate electrode and the other conductive layers does not occur easily. Since there is no difference in level corresponding to the film thickness of the gate electrode on the surface of the semiconductor substrate after forming the gate electrodes, i.e. the surface of the semiconductor substrate is almost flat, the deposited film thickness of the insulating film on the gate electrode can be made thinner. Consequently, the depth of the connection hole for connecting the semiconductor substrate and the conductive layers located above the gate electrode can be made shallower and an excellent covering condition inside the connection hole can be obtained in the conductive layers. Therefore, poor electric connection of the conductive layers in the connection hole can be prevented, and thus a highly reliable semiconductor storage unit can be manufactured easily. In addition, a switching transistor region of a memory cell and an isolation region between memory cells are formed simultaneously, thus reducing the number of manufacturing processes and manufacturing costs.

It is preferable that after forming the gate electrode the method further comprises: depositing a fourth insulating film on the semiconductor substrate, flattening the fourth insulating film, and then forming a first connection hole in the fourth insulating film by photoetching, with the first connection hole reaching the surface of the semiconductor substrate; depositing a second conductive film on the semiconductor substrate and then forming a bit line by photoetching; depositing a fifth insulating film on the semiconductor substrate, flattening the fifth insulating film and then forming a second connection hole in the fifth insulating film by photoetching, with the second connection hole reaching the surface of the semiconductor substrate; and depositing a third conductive film on the semiconductor substrate and then forming a charge-storage electrode by photoetching.

It is also preferable that after forming the charge-storage electrode, he method further comprises depositing a capacity insulating film and a fourth conductive film sequentially and then forming a plate electrode by photoetching.

It is further preferable that the first openings are formed using a mask pattern formed by combining two figures that are not in contact with each other in an active region of a unit memory cell. According to the method of manufacturing a semiconductor storage unit described above, it is possible to specify the isolation region between the memory cells and the impurity-diffusion layer region simultaneously, thus reducing the number of manufacturing processes and manufacturing costs.

It is preferable that the first openings are formed using a mask pattern formed by combining two congruent figures that are not in contact with each other in an active region of a unit memory cell. According to the method of manufacturing a semiconductor storage unit described above, the isolation region between the memory cells and the impurity-diffusion layer region can be specified simultaneously, thus reducing the number of manufacturing processes and manufacturing costs. Furthermore, since the mask pattern is formed by combining two congruent figures, the memory cell region can be made smaller than that in the case where the two figures are not congruent. This enables higher integration.

It is preferable that after forming the gate electrode the method described above further comprises: depositing a fourth insulating film on the semiconductor substrate, flattening the fourth insulating film, and then forming a first connection hole in the fourth insulating film by photoetching, with the first connection hole reaching the surface of the semiconductor substrate; depositing a second conductive film on the semiconductor substrate and then forming a charge-storage electrode by photoetching; depositing a capacity insulating film and a third conductive film on the semiconductor substrate and then forming a plate electrode by photoetching; depositing a fifth insulating film on the semiconductor substrate, flattening the fifth insulating film, and then forming a second connection hole in the fifth insulating film by photoetching, with the second connection hole reaching the surface of the semiconductor substrate; and depositing a fourth conductive film on the semiconductor substrate and then forming a bit line by photoetching.

It is further preferable that the method described above further comprises: after forming the first openings and before forming the filled-in layer, forming a second impurity-diffusion layer having a reverse conductive type as compared to that of the semiconductor substrate in the first openings.

It is preferable that the method described above further comprises: after forming the second openings and before forming the third insulating film, forming a third impurity-diffusion layer having the same conductive type as that of the semiconductor substrate in the first openings, with the third impurity-diffusion layer isolating the second impurity-diffusion layer. As described above, the formation of the third impurity-diffusion layer enables reliable threshold voltage control of a switching transistor of a memory cell. That is to say, even in the case of miniaturizing a semiconductor storage unit, when the second impurity-diffusion layer is isolated by the third impurity-diffusion layer and these isolated impurity-diffusion layers are used as a source and a drain, the on-off control of the switching transistor can be performed at the gate electrodes.

It is preferable that the depth of the third impurity-diffusion layer is deeper than that of the second impurity-diffusion layer. According to the method of manufacturing a semiconductor storage unit as described above, the second impurity-diffusion layer can be isolated by the third impurity-diffusion layer securely.

It is preferable that the second impurity-diffusion layers are formed by ion implantation at an implantation angle of less than 90° with respective to the surface of the semiconductor substrate.

According to the method of manufacturing a semiconductor storage unit described above, the impurity-diffusion layer in a memory cell is formed within the first openings. Consequently, a memory cell switching transistor provided with the gate electrode within the semiconductor substrate can be formed.

Further, it is preferable that the depth of the first opening is deeper than that of the first impurity-diffusion layer.

According to the method of manufacturing a semiconductor storage unit described above, the impurity-diffusion layer region forming the switching transistor and the region where the gate electrode is provided are specified within the semiconductor substrate. At the same time, the conductive layers in the element-isolation region are removed. Consequently, a highly reliable semiconductor storage unit can be manufactured.

It is further preferable that the second openings are formed so that the depth of the second opening measured from the surface of the semiconductor substrate is equal to or deeper than that of the first opening measured from the surface of the semiconductor substrate and is shallower than that of the second impurity-diffusion layer at the bottom of the second opening measured from the surface of the semiconductor substrate.

According to the method of manufacturing a semiconductor storage unit described above, the region where the gate electrode is provided and the region where the gate electrode is insulated from the other conductive layers are specified within the semiconductor substrate simultaneously, thus reducing the number of manufacturing processes and manufacturing costs.

BRIEF DESCRIPTION OF THE INVENTION

FIGS. 3(a)–(d) are cross-sectional views showing manufacturing processes for the semiconductor storage unit.

FIGS. 4(a)–(d) are cross-sectional views showing manufacturing processes for the semiconductor storage unit.

Figure 5:
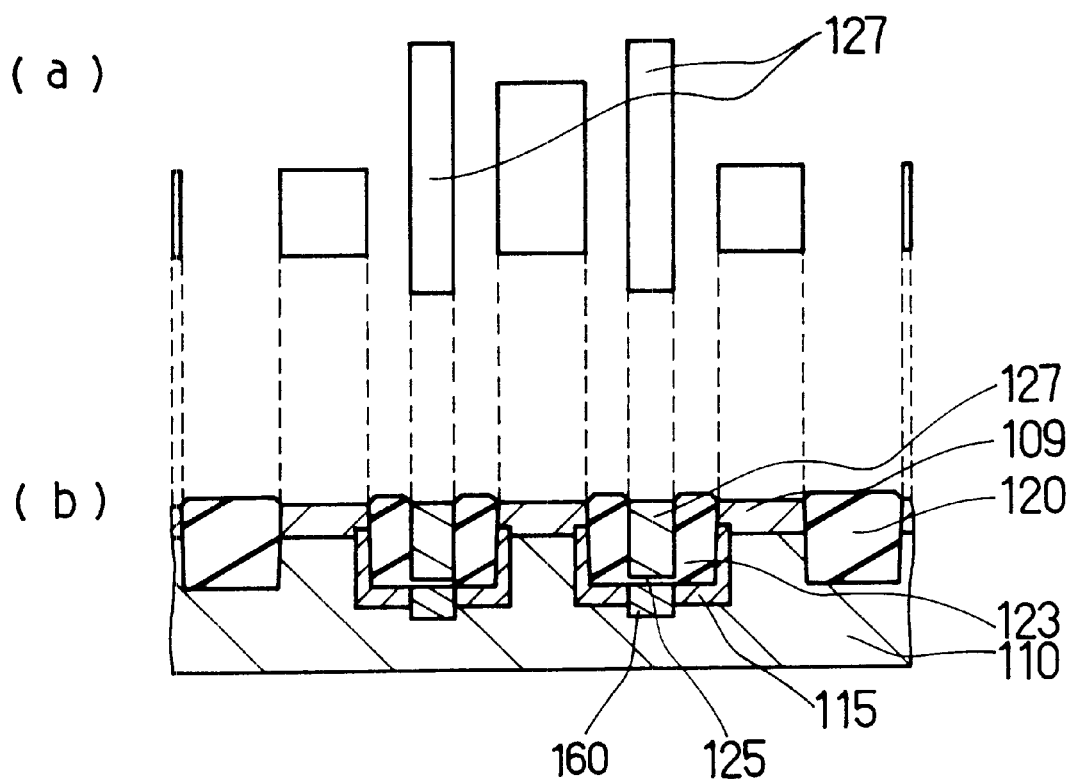

FIG. 5(a) is a plan view and FIG. 5(b) is a cross-sectional view showing a manufacturing process for the semiconductor storage unit.

Figure 6:
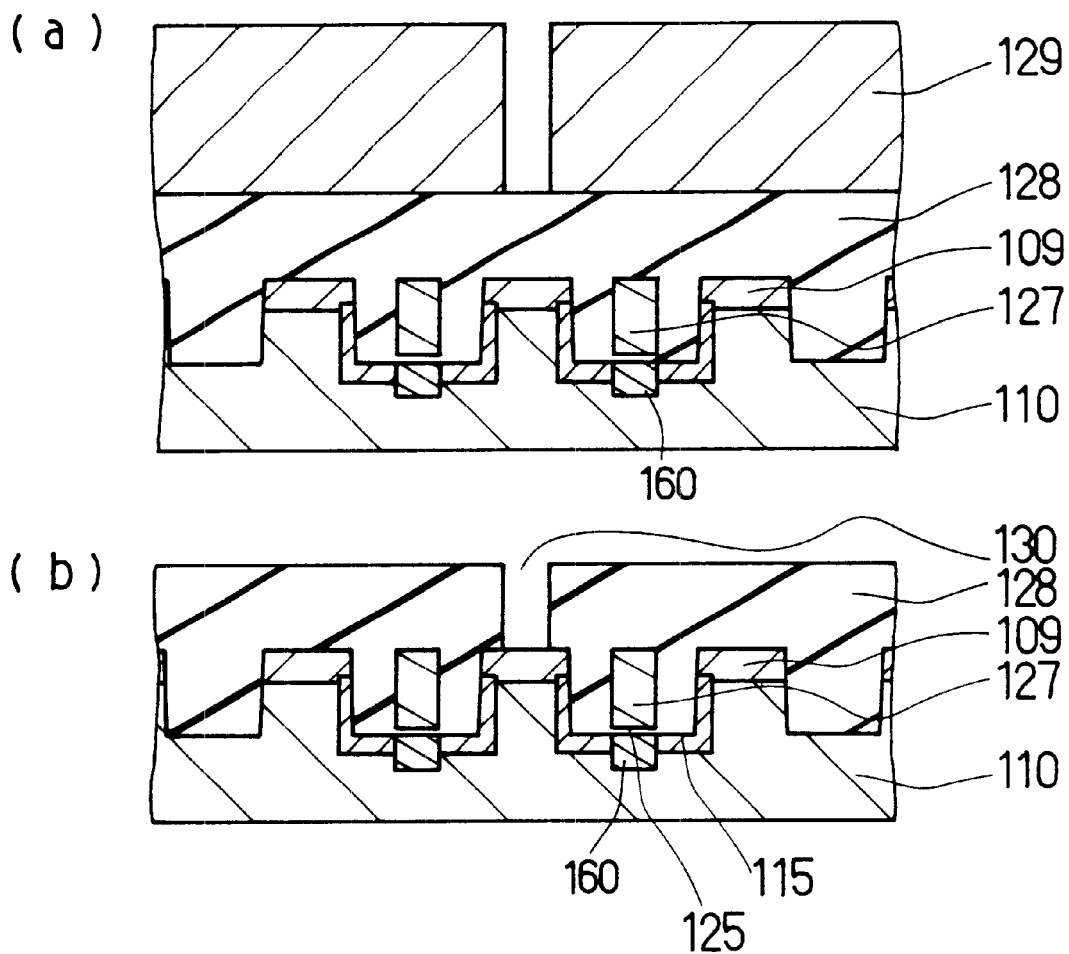

FIGS. 6(a) and (b) are cross-sectional views showing manufacturing processes for the semiconductor storage unit.

Figure 7:
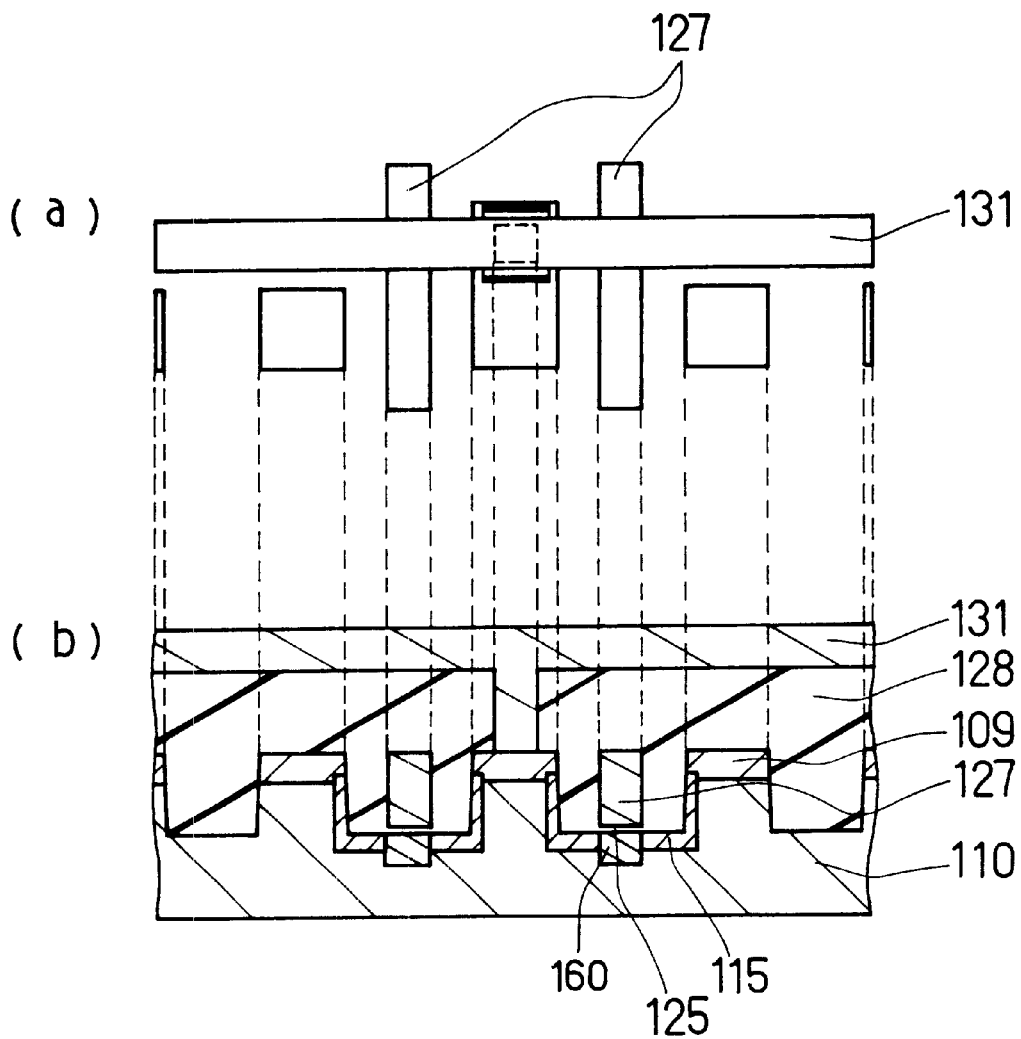

FIG. 7(a) is a plan view and FIG. 7(b) is a cross-sectional view showing a manufacturing process for the semiconductor storage unit.

Figure 8:
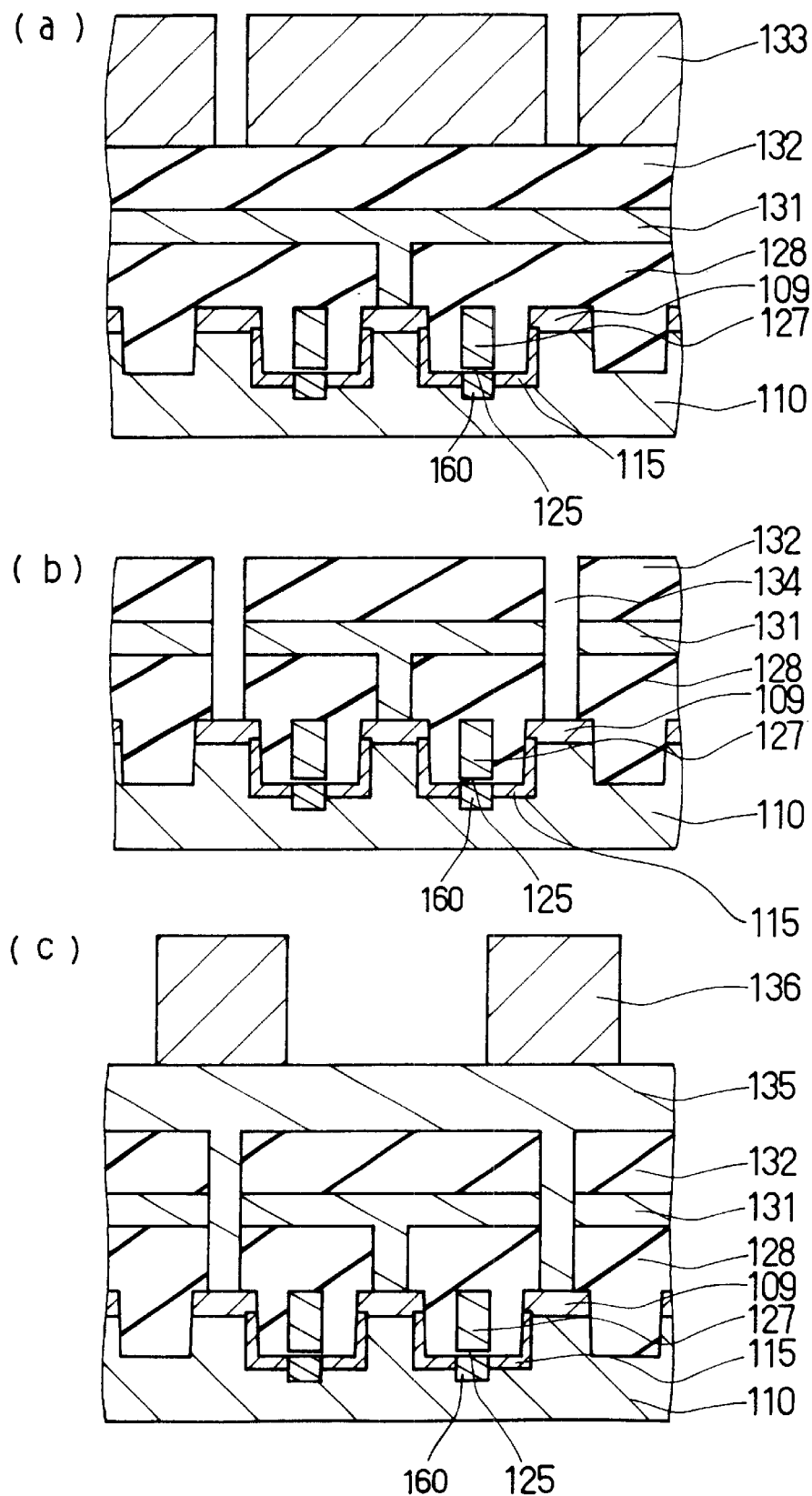

FIGS. 8(a)–(c) are cross-sectional views showing manufacturing processes for the semiconductor storage unit.

Figure 9:
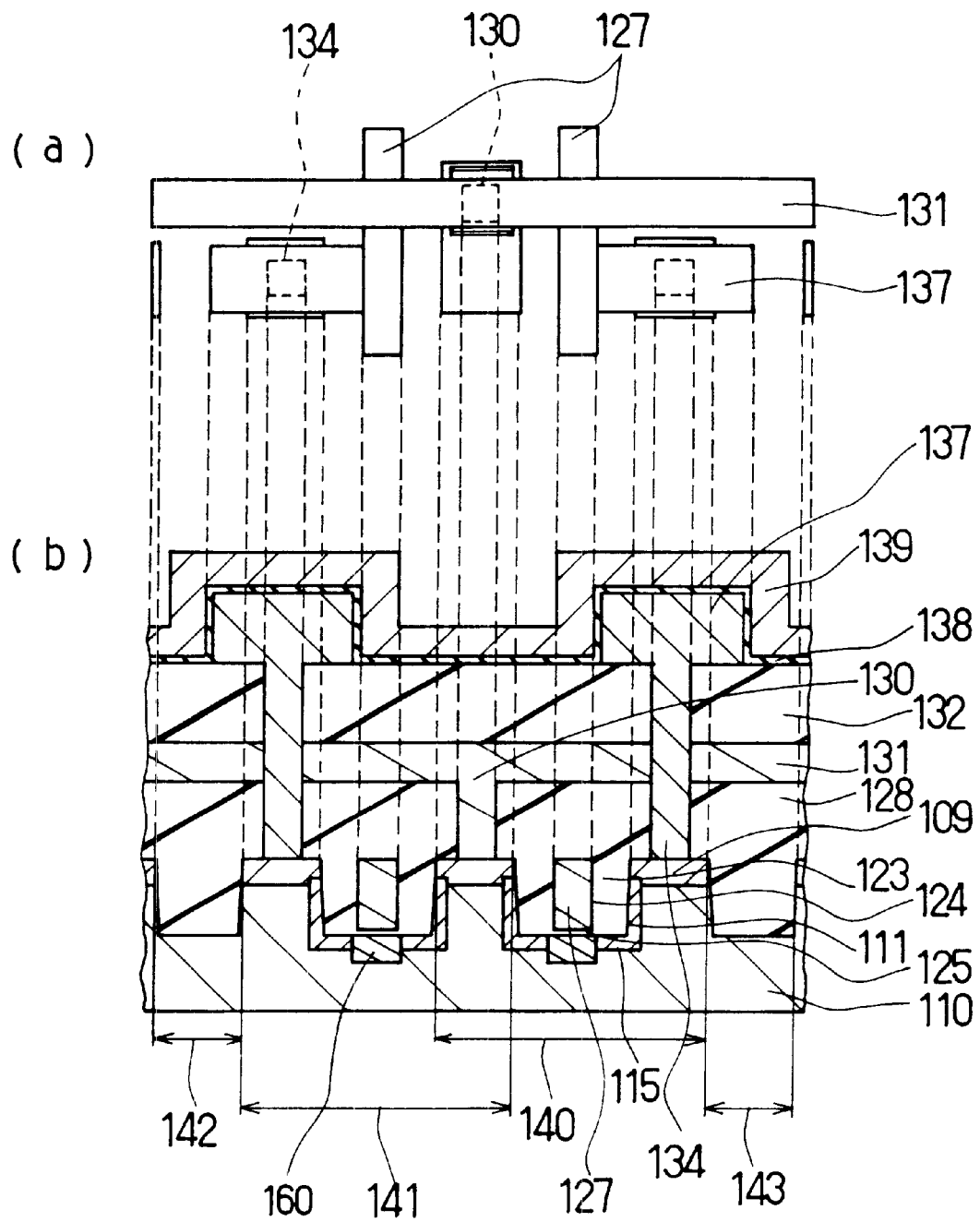

FIG. 9(a) is a plan view and FIG. 9(b) is a cross-sectional view showing a manufacturing process for the semiconductor storage unit.

Figure 10:
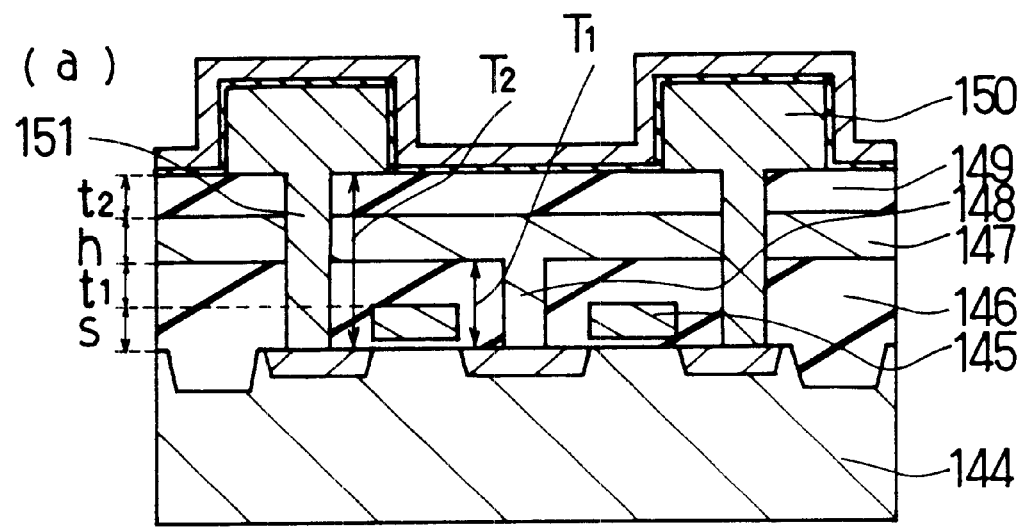
Figure 10:
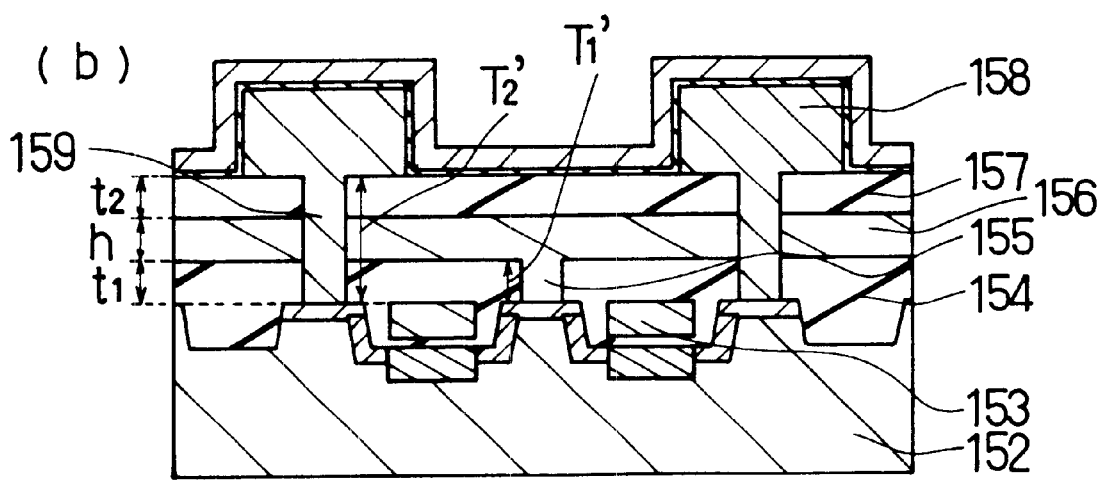

FIG. 10(a) is a cross-sectional view showing a conventional semiconductor storage unit and FIG. 10(b) is a cross-sectional view showing the semiconductor storage unit according to Embodiment 1 of the present invention.

Figure 11:
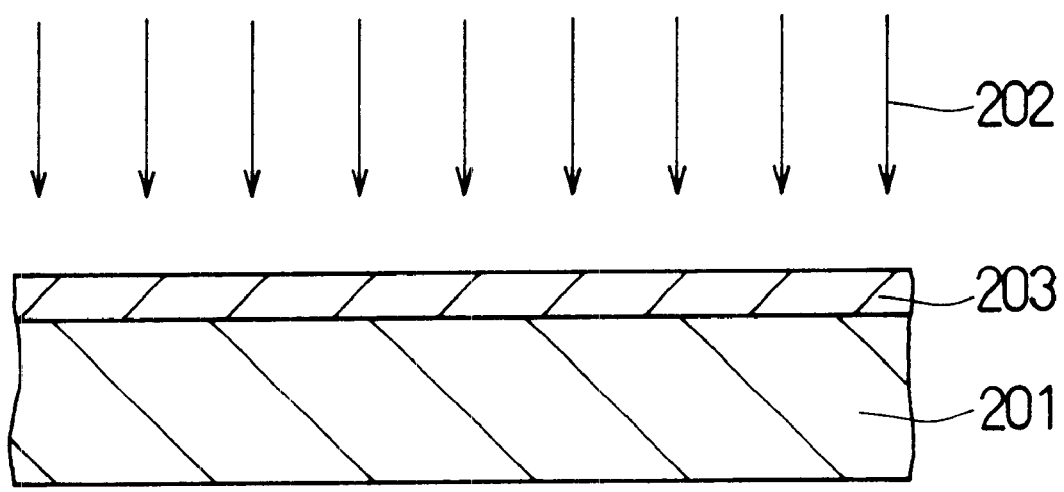

FIG. 11 is a cross-sectional view showing a manufacturing process for a semiconductor storage unit according to Embodiment 2 of the present invention.

FIG. 12(a) is a plan view and FIG. 12(b) is a cross-sectional view showing a manufacturing process for the semiconductor storage unit.

FIGS. 13(a)–(d) are cross-sectional views showing manufacturing processes for the semiconductor storage unit.

FIGS. 14(a)–(d) are cross-sectional views showing manufacturing processes for the semiconductor storage unit.

Figure 15:
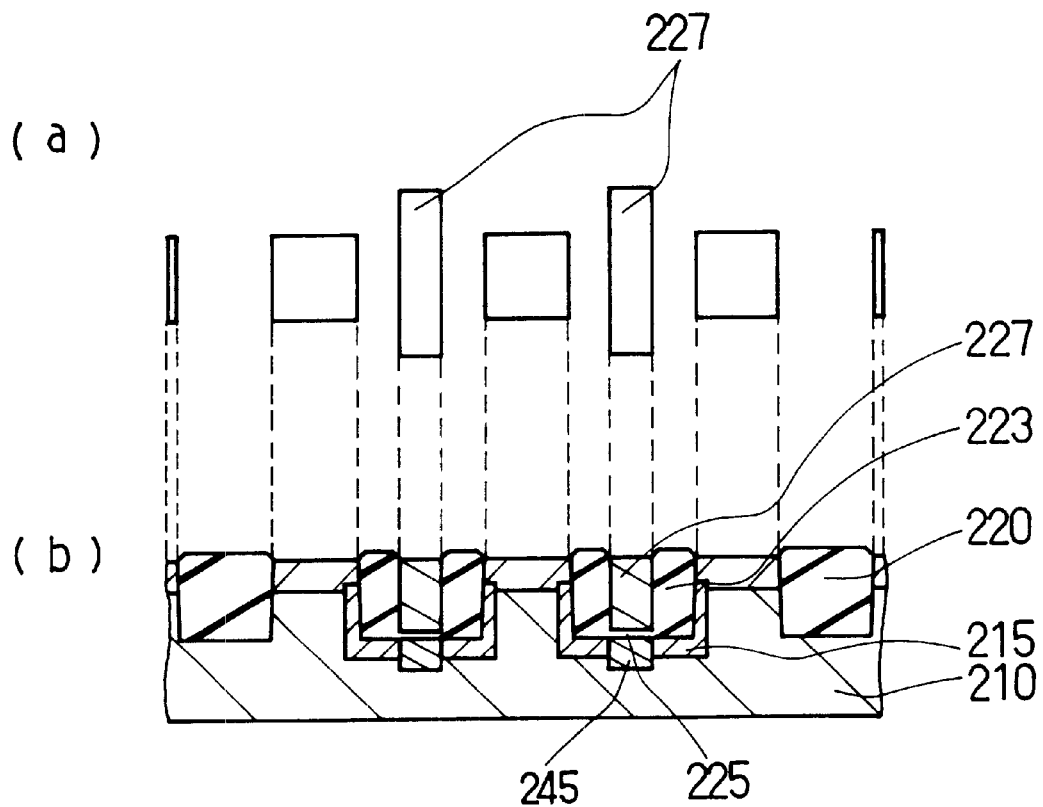
Figure 16:
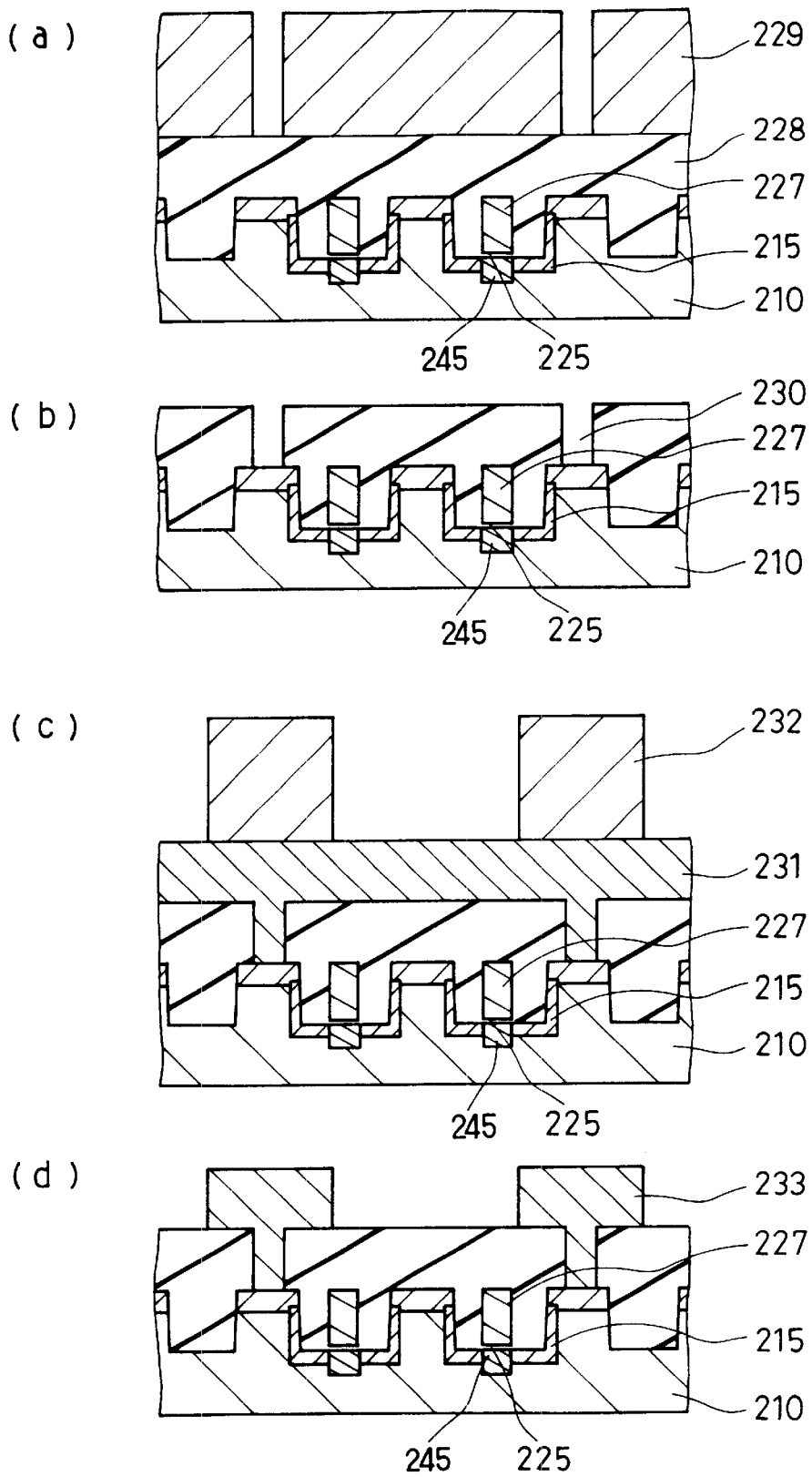

FIG. 15(a) is a plan view and FIG. 15(b) is a cross-sectional view showing a manufacturing process for the semiconductor storage unit.

FIGS. 16(a)–(d) are cross-sectional views showing manufacturing processes for the semiconductor storage unit.

FIG. 17(a) is a plan view and FIG. 17(b) is a cross-sectional view showing a manufacturing process for the semiconductor storage unit.

Figure 18:
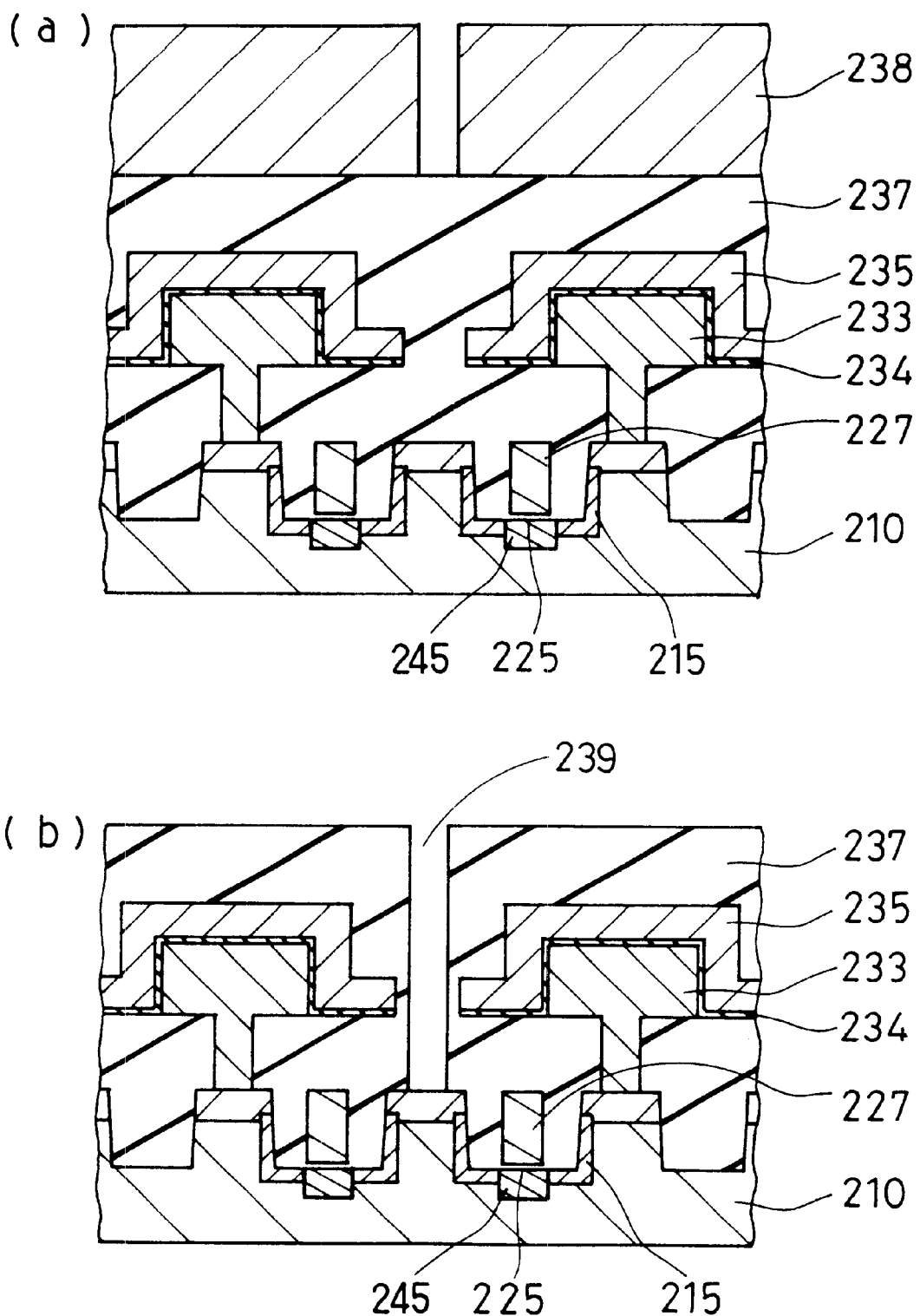

FIGS. 18(a) and (b) are cross-sectional views showing manufacturing processes for the semiconductor storage unit.

Figure 19:
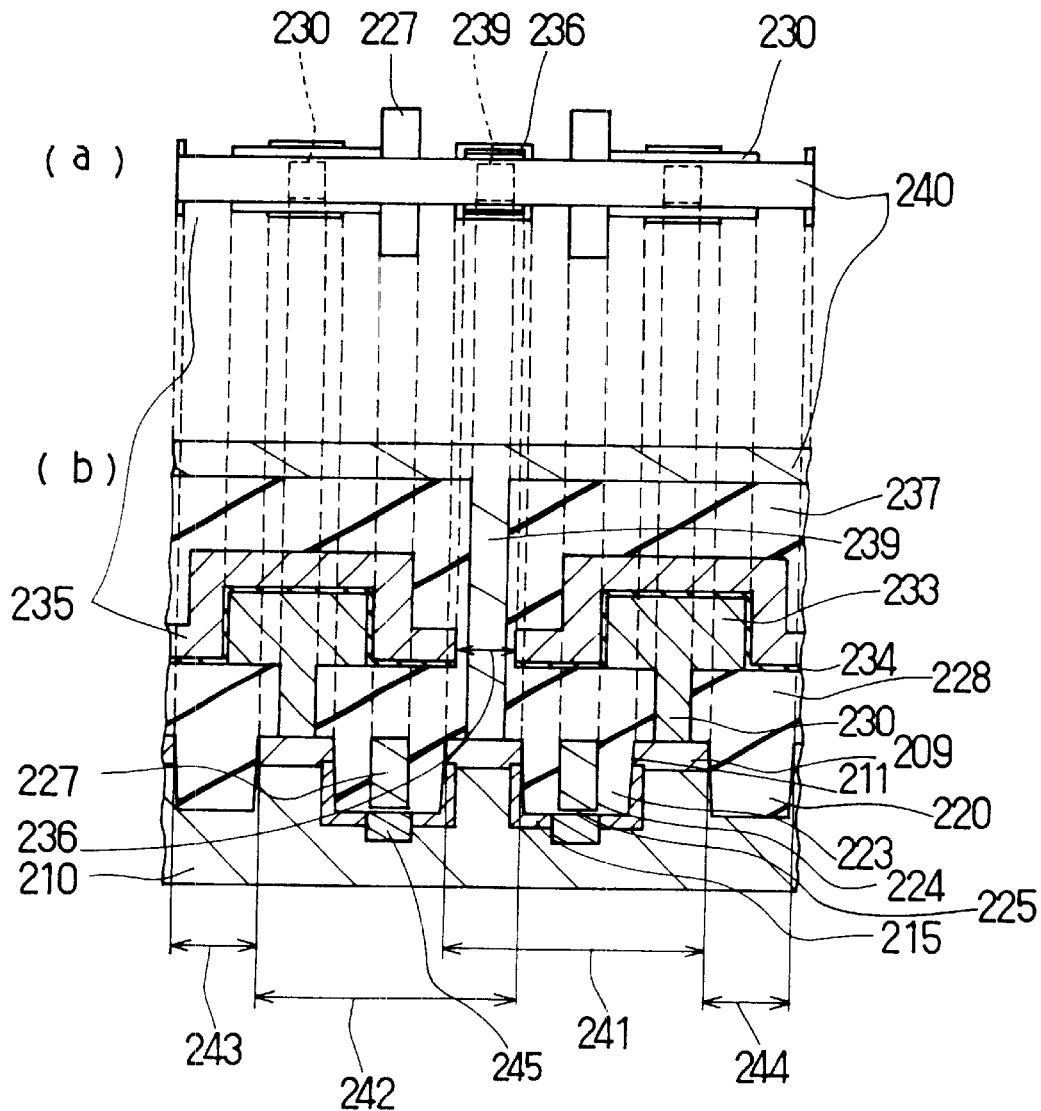
Figure 20:
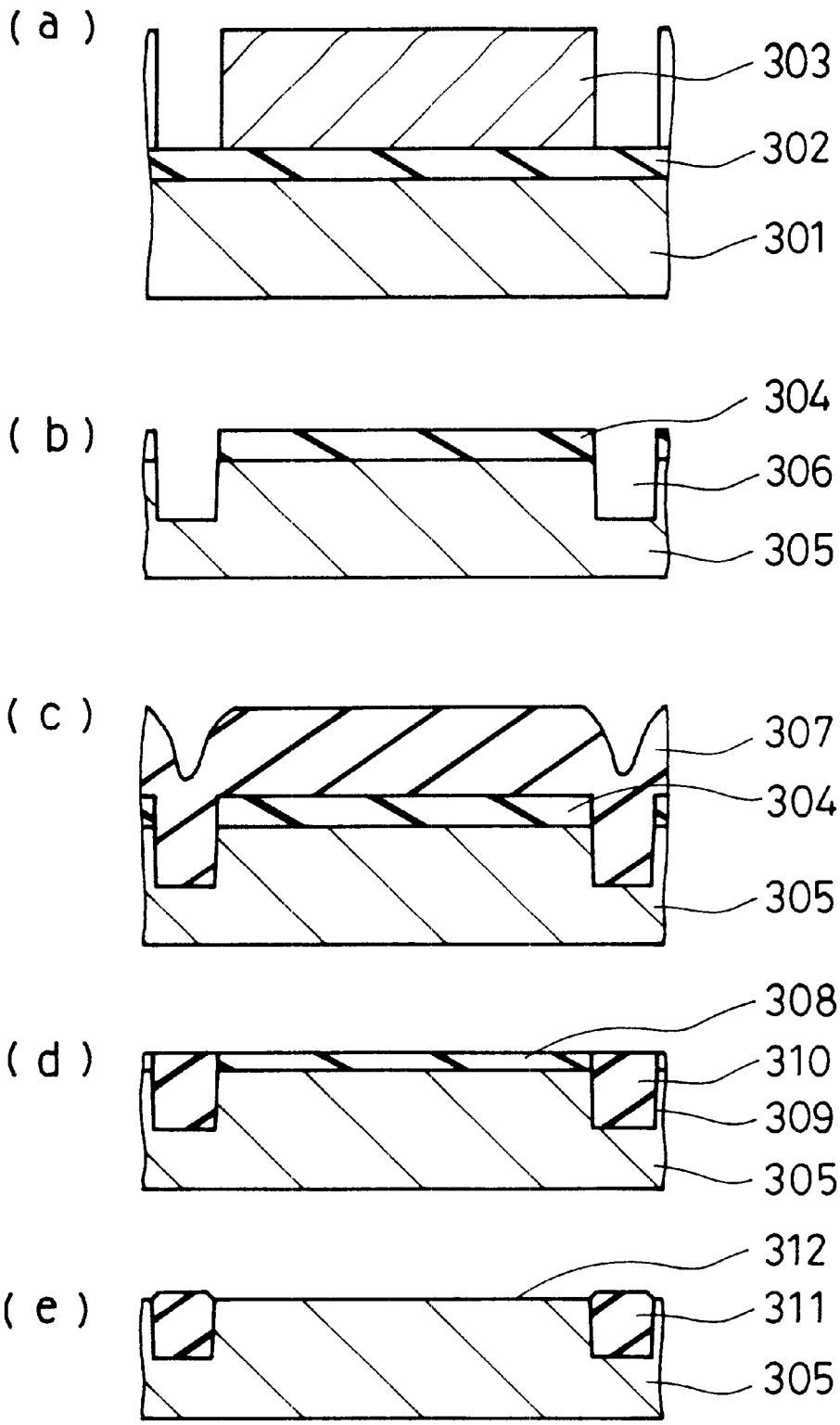
Figure 21:
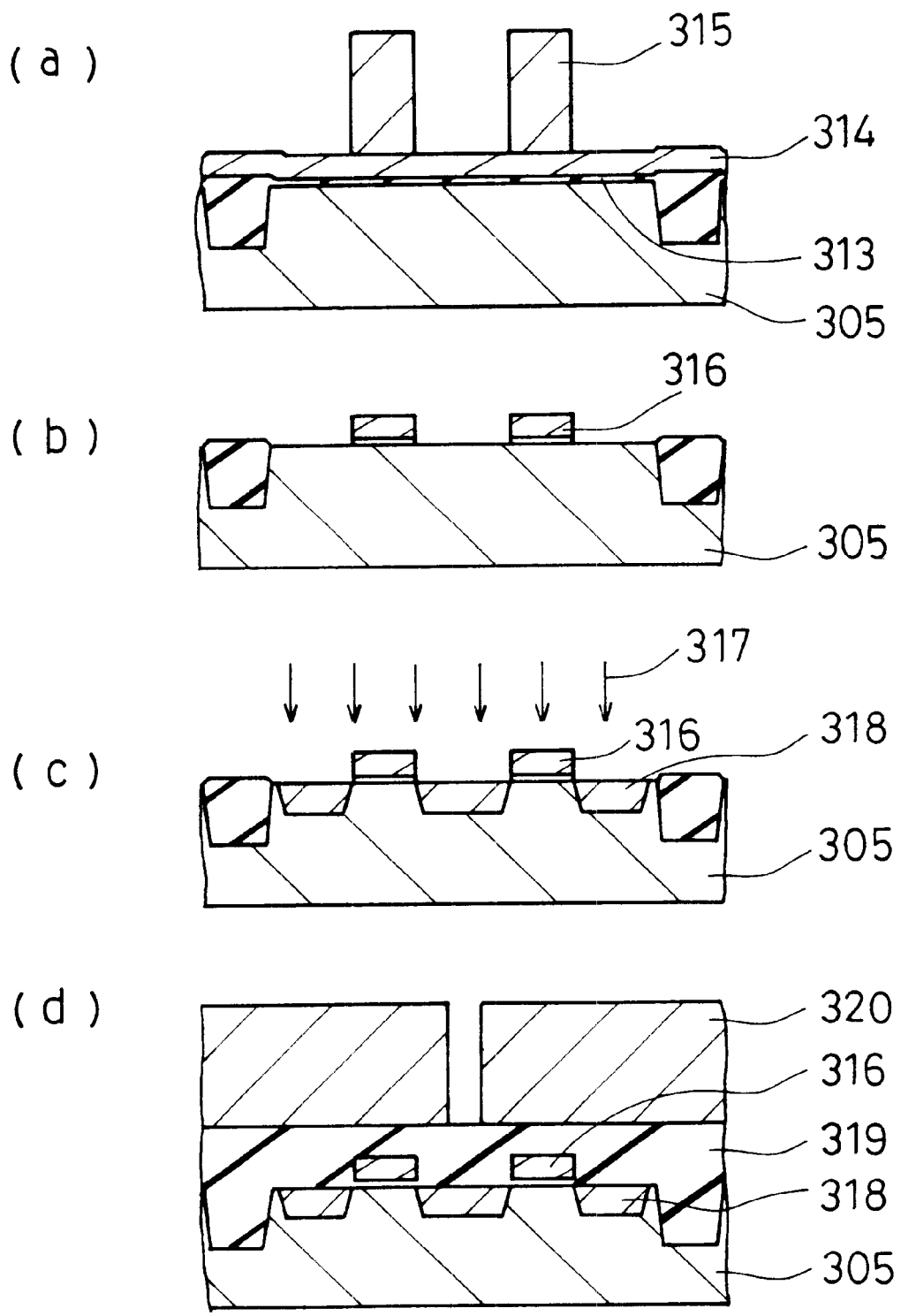
Figure 22:
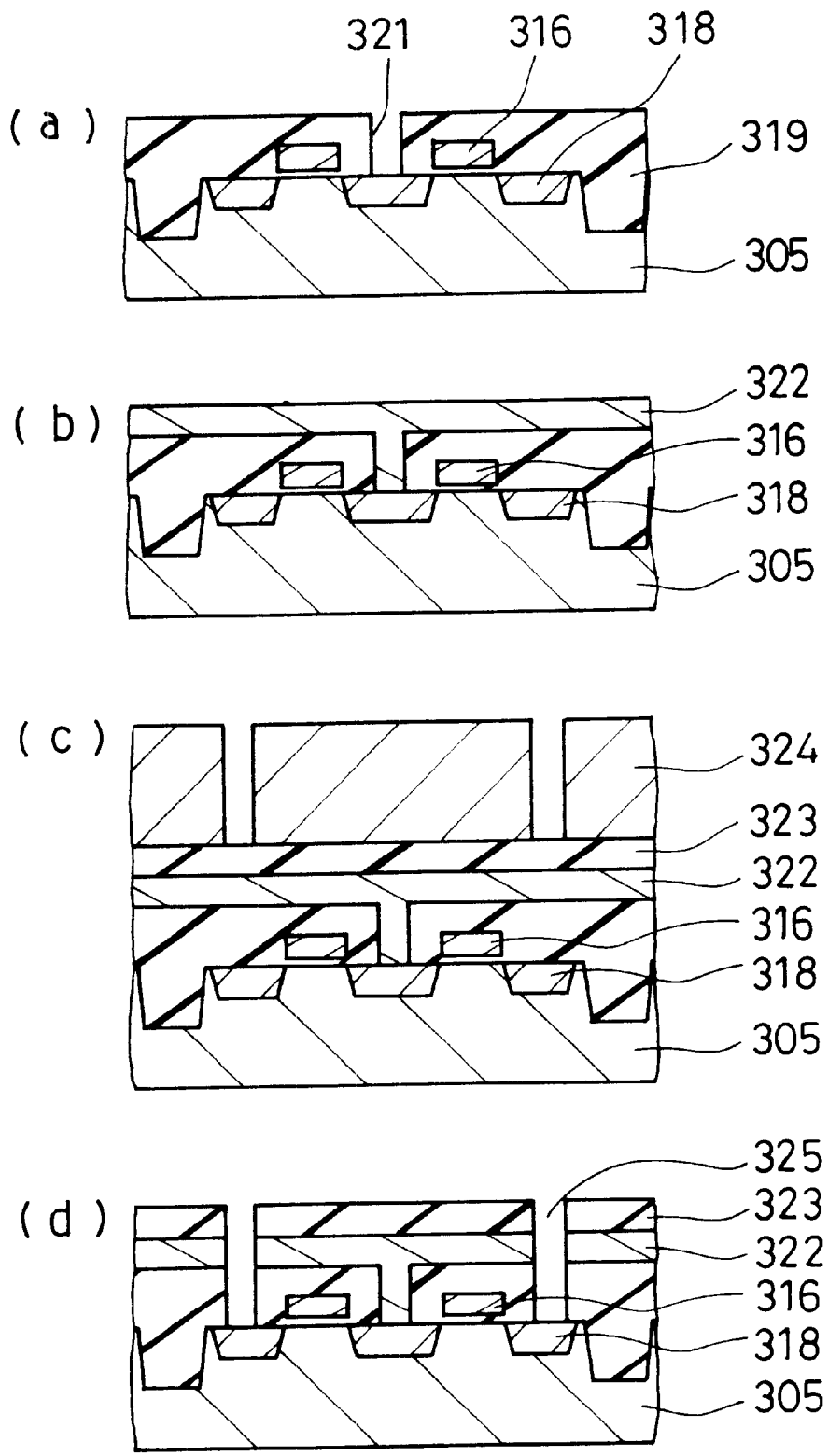

FIG. 19(a) is a plan view and FIG. 19(b) is a cross-sectional view showing a manufacturing process for the semiconductor storage unit.

FIGS. 20(a)–(e) are cross-sectional views showing manufacturing processes for a conventional semiconductor storage unit.

FIGS. 21(a)–(d) are cross-sectional views showing manufacturing processes for the conventional semiconductor storage unit.

FIGS. 22(a)–(d) are cross-sectional views showing manufacturing processes for the conventional semiconductor storage unit.

Figure 23:
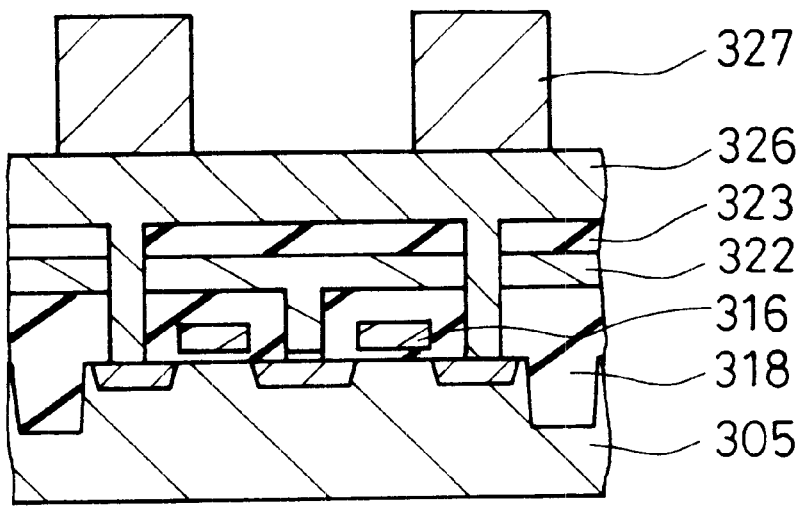
Figure 23:
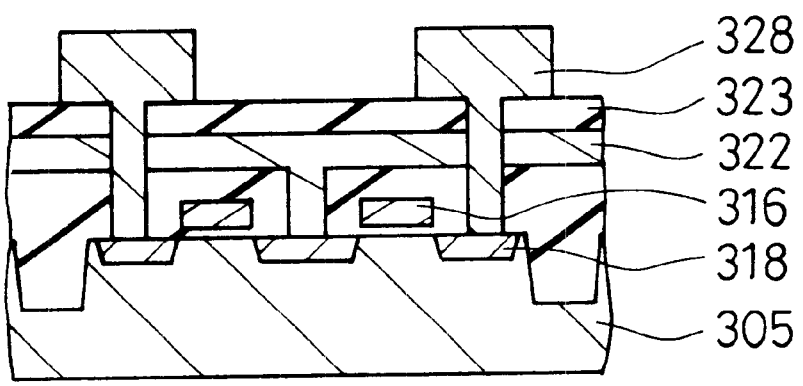
Figure 23:
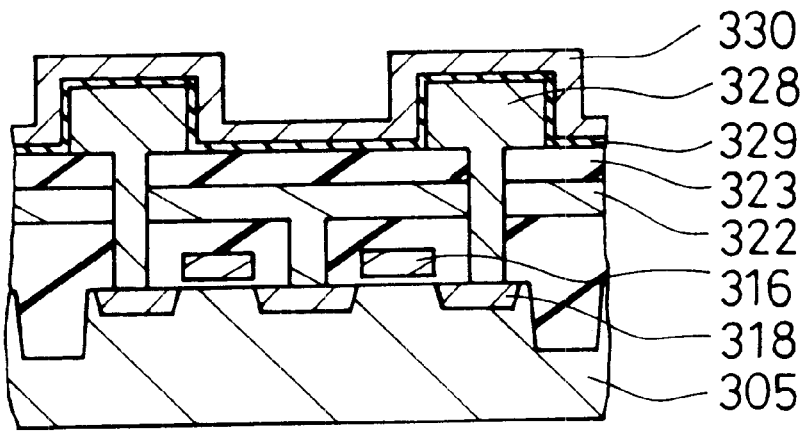

FIGS. 23(a)–(c) are cross-sectional views showing manufacturing processes for the conventional semiconductor storage unit.

DETAILED DESCRIPTION OF THE DRAWINGS

Embodiment 1

A semiconductor storage unit according to Embodiment 1 and a method of manufacturing the same will be explained with reference to FIGS. 1–10 as follows. Each plan view in the figures shows only important parts and the other parts are omitted therein.

Figure 1:
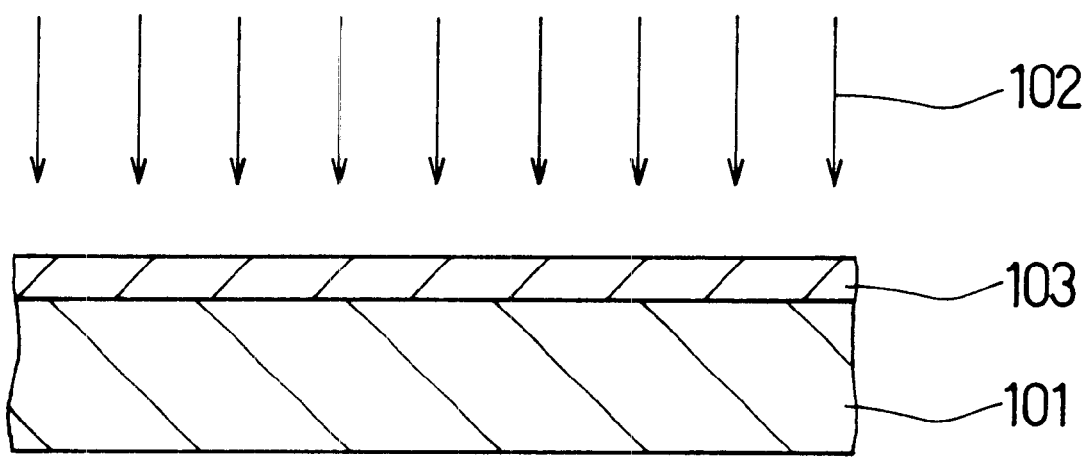
FIG. 1 is a cross-sectional view showing a manufacturing process for a semiconductor storage unit according to Embodiment 1 of the present invention.
Figure 2:
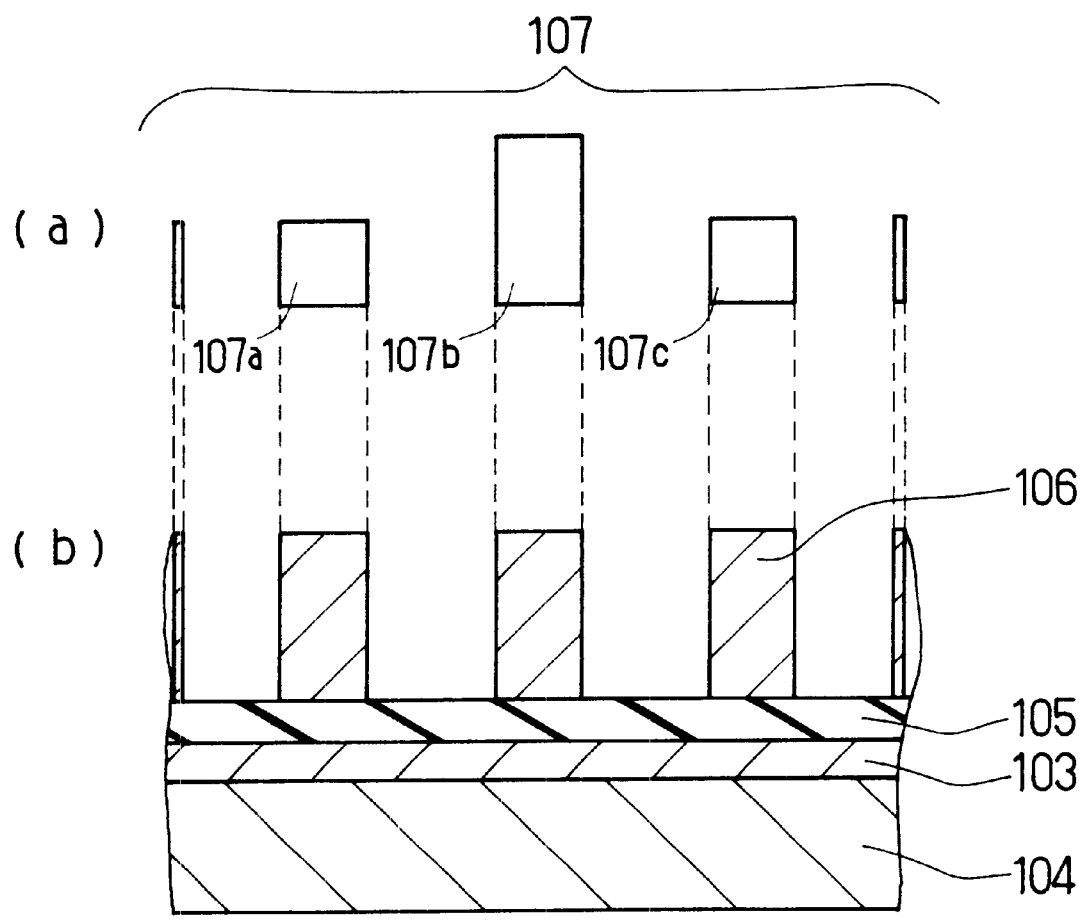
FIG. 2(a) is a plan view and FIG. 2(b) is a cross-sectional view showing a manufacturing process for the semiconductor storage unit.
Figure 3:
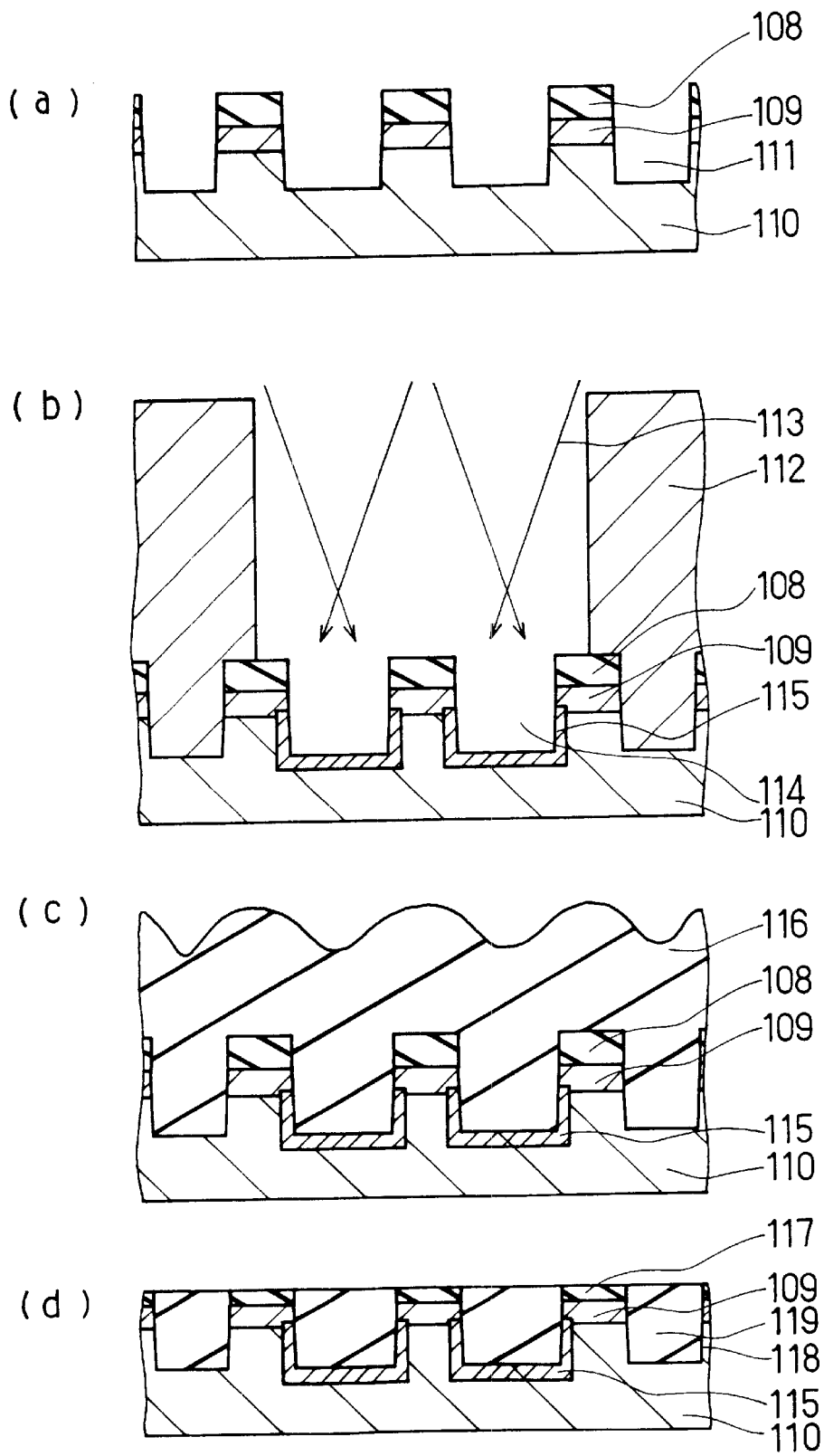
Figure 4:
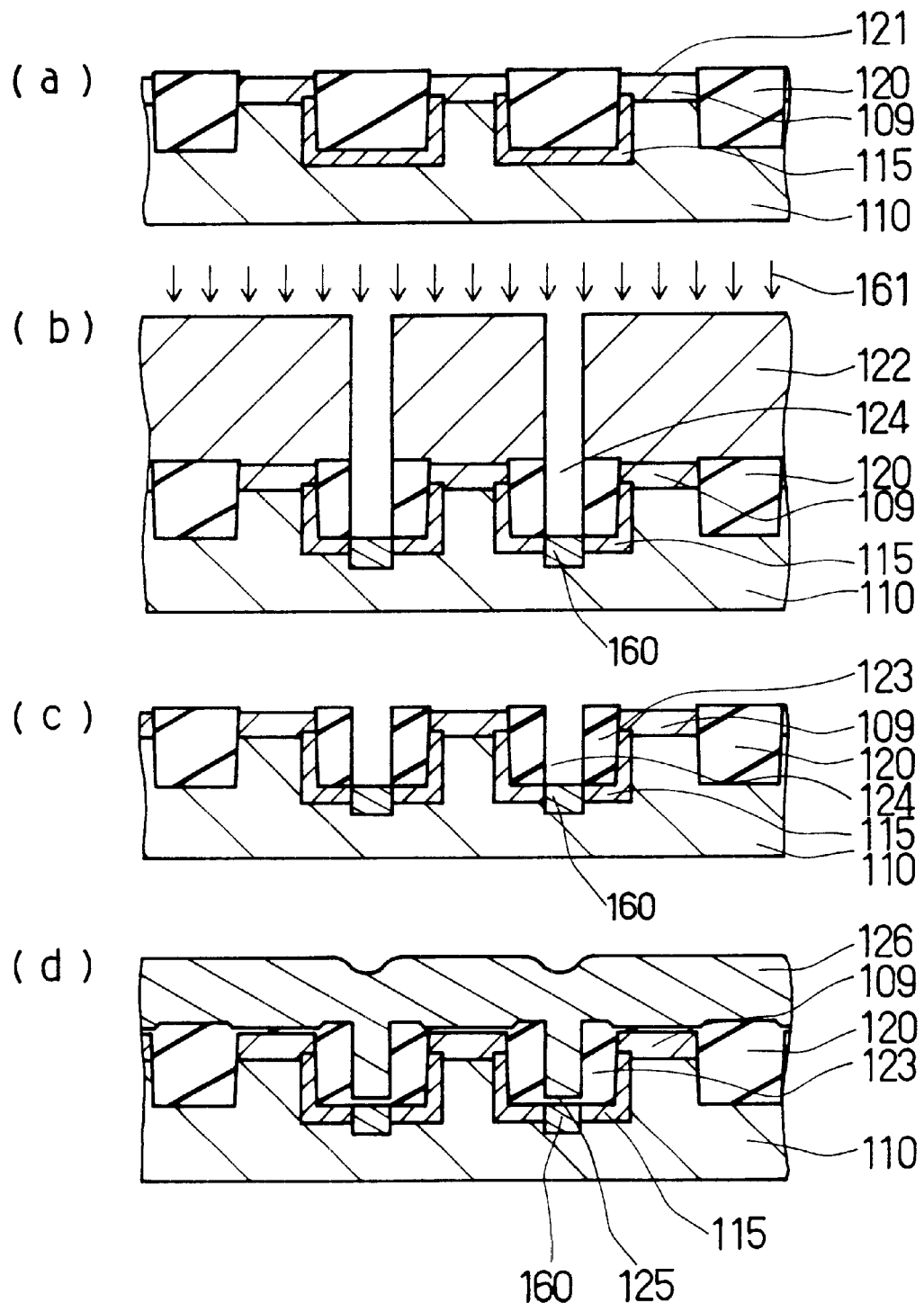

In a process shown in FIG. 1, a first impurity-diffusion layer 103 is formed on a semiconductor substrate (a silicon substrate) 101 by ion implantation 102. The first impurity-diffusion layer 103 has a reverse conductive type as compared to that of the semiconductor substrate 101. In a process shown in FIG. 2(b), a laminated film 105 of a silicon nitride film and a silicon oxide film is formed on the semiconductor substrate 104. A photoresist 106 is formed by a mask pattern 107. FIG. 2(a) is a plan view of FIG. 2(b). As shown in FIG. 2(a), the mask pattern 107 is formed by combining two figures that are not in contact with each other in a unit memory cell region. The combination of two figures means a combination of mask patterns 107a and 107b or a combination of mask patterns 107b and 107c.

In a process shown in FIG. 3(a), a part of the laminated film 108 is removed by photoetching. Then, a part of the semiconductor substrate 110 is removed so as to form first openings 111, which are deeper than the impurity diffusion layer 109.

In a process shown in FIG. 3(b), using a photoresist 112, a second impurity-diffusion layer 115 is formed on the side walls and a part of the bottom face of specific first openings 114 by ion implantation 113. The second impurity-diffusion layer 115 has a reverse conductive type as compared to that of the semiconductor substrate 110.

In a process shown in FIG. 3(c), a CVD silicon oxide film 116 is deposited. In a process shown in FIG. 3(d), a part of the laminated film 108 and a part of the silicon oxide film 116 are removed by polishing to flatten the whole surface and to leave a filled-in film 119 within the first openings 118. In a process shown in FIG. 4(a), the whole laminated film 117 and a part of the filled-in film 119 are removed by wet etching to leave a part of the filled-in film 120 and to expose the surface 121 of the semiconductor substrate.

In processes shown in FIGS. 4(b) and (c), a photoresist 122 is used to remove a part of the filled-in film 123 by photoetching to form second openings 124. Subsequently, a third impurity-diffusion layer 160 having the same conductive type as that of the semiconductor substrate 110 is formed by ion implantation 161 so as to be deeper than the second impurity-diffusion layer 115. This enables the second impurity-diffusion layer 115 to be isolated by the third impurity-diffusion layer 160 securely. Then the photoresist 122 is removed.

In a process shown in FIG. 4(d), a gate oxide film 125 and a polysilicon film 126 containing impurities are formed sequentially. A gate electrode 127 is then formed by etch-back in a process shown in FIG. 5(b). FIG. 5(a) shows a plan view of FIG. 5(b). In processes shown in FIGS. 6(a) and (b), a CVD silicon oxide film 128 is deposited and flattened. Then, using a photoresist 129 a contact hole (a connection hole) 130 is formed by photoetching.

In a process shown in FIG. 7(b), after depositing a laminated film of a tungsten silicide film and a polysilicon film containing impurities, a bit line 131 is formed by photoetching. FIG. 7(a) shows a plan view of FIG. 7(b). In processes shown in FIGS. 8(a) and (b), a CVD silicon oxide film 132 is deposited and flattened, and then a contact hole (a connection hole) 134 is formed using a photoresist 133 by photoetching.

In a process shown in FIG. 8(c), a polysilicon film 135 containing impurities is deposited. In a process shown in FIG. 9(b), using a photoresist 136, a charge-storage electrode 137 is formed by photoetching. Then, a capacity insulating film 138 formed of a laminated film of a silicon oxide film and a silicon nitride film and a polysilicon film containing impurities are formed sequentially, thus forming a plate electrode 139 by photoetching. FIG. 9(a) shows a plan view of FIG. 9(b).

In a semiconductor storage unit manufactured by the processes described above, as shown in FIG. 9(b) the gate electrode 127 is formed within the second opening 124 formed in a specific region of the first opening 111 within the semiconductor substrate 110. Therefore, the gate electrode 127 is surrounded by and covered with the insulating films of the filled-in film 123 and the CVD silicon oxide film 128. Consequently, the short circuit between the gate electrode 127 and the other conductive layers does not occur easily, thus obtaining a highly reliable semiconductor storage unit.

The second impurity-diffusion layer 115 having a reverse conductive type as compared to that of the semiconductor substrate 110 is isolated by the third impurity-diffusion layer 160 having the same conductive type as that of the semiconductor substrate 110. Then, one of the isolated second impurity-diffusion layers 115 and a first impurity-diffusion layer 109 connected thereto can be used as a source, and the other second impurity-diffusion layer 115 and a first impurity-diffusion layer 109 connected thereto can be used as a drain.

Furthermore, the formation of the third impurity-diffusion layer 160 as described above enables reliable threshold voltage control of a switching transistor of a memory cell. That is to say, even in the case of miniaturizing a semiconductor storage unit, when the second impurity-diffusion layer 115 is isolated by the third impurity-diffusion layer 160 and these isolated second impurity-diffusion layers 115 are used as a source and a drain, on-off control of the switching transistor can be performed at the gate electrodes.

In the present embodiment, the second impurity-diffusion layer 115 is isolated by forming the third impurity-diffusion layer 160. However, the third impurity-diffusion layer 160 may not be formed when the second impurity-diffusion layer 115 is formed by the ion implantation 113 to be isolated in advance in the process shown in FIG. 3(b). This method is effective in the case where the gate electrode is relatively long and there is a sufficient space between the source and the drain.

Unit memory cells (active regions) 140 and 141 and isolation regions 142 and 143 between adjacent memory cells shown in FIG. 9(b) are specified by forming the first openings 111 using the mask pattern 107 (see FIG. 2) with simple figures. By forming the second openings 124, the region of the gate electrode 127 is specified. In addition, the regions 123 covering the gate electrode 127 and insulating the gate electrode 127 from the other conductive layers are formed. Consequently, the manufacturing processes are simplified and the number of manufacturing processes is reduced, thus reducing manufacturing costs.

FIG. 10(a) is a conventional example of a semiconductor storage unit for comparison with the semiconductor storage unit according to the present embodiment. As shown in FIG. 10(a), in a conventional semiconductor storage unit, a gate electrode 145 is provided on a semiconductor substrate 144, resulting in a difference s in level. Therefore, when a thickness $t_1$, of an insulating film 146 that is necessary for obtaining reliable insulation between the gate electrode 145 and a bit line 147 is provided, the depth $T_1$ of a connection hole 148 for connecting the bit line 147 and the semiconductor substrate 144 is expressed by $s+t_1$. When a thickness $t_2$ of an insulating film 149 that is necessary for obtaining reliable insulation between the bit line 147 having a film thickness h and a charge-storage electrode 150 is provided, the depth $T_2$ of a connection hole 151 for connecting the charge-storage electrode 150 and the semiconductor substrate 144 is expressed by $s+t_1+h+t_2$.

On the other hand, in the semiconductor storage unit according to the present embodiment shown in FIG. 10(b), the gate electrode 153 is provided within the semiconductor substrate 152. Therefore, the depth $T_1'$ of the connection hole 155 for connecting the bit line 156 and the semiconductor substrate 152 and the depth $T_2'$ of the connection hole 159 for connecting the charge-storage electrode 158 and the semiconductor substrate 152 are expressed by $t_1$ and $t_1+h+t_2$, respectively, wherein $t_1$ indicates the thickness of the insulating film 154, h indicates the film thickness of the bit line 155, and $t_2$ indicates the thickness of the insulating film 157.

As described above, the depth of the connection hole for connecting the conductive layers located above the gate electrode and the semiconductor substrate can be made shallower, thus obtaining an excellent covering condition inside the connection hole in the conductive layers. Thus, poor electric connection of the conductive layers in the connection hole can be prevented. Consequently, a highly reliable semiconductor storage unit can be manufactured easily.

In Embodiment 1, the mask pattern 107 was formed by combining two figures that were not in contact with each other in a unit memory cell. However, the mask pattern 107 may be formed by combining two congruent figures that are not in contact with each other. In this case, it is necessary to provide a region within the bit line where a connection hole for connecting the charge-storage electrode and the semiconductor substrate passes through. Further, when employing a shape formed by going around the opening region of the connection hole for connecting the charge-storage electrode and the semiconductor substrate as the shape of the bit line instead of a straight-line shape, the mask pattern formed by combining two congruent figures can be used without providing a region where a connection hole passes through in the mask pattern portion of such a bit line as described above.

In Embodiment 1, the gate electrode 127 was formed of a polysilicon film containing impurities. However, the gate electrode 127 may be formed of: a monolayer film such as a tungsten film, a molybdenum film, a titanium film, a platinum film, a tungsten-silicide film, a molybdenum-silicide film, a titanium-silicide film, or a platinum-silicide film; or a laminated film of a polysilicon film containing impurities and a tungsten-silicide film, a molybdenum-silicide film, a titanium-silicide film, or a platinum-silicide film.

The bit line 131 was formed of a laminated film of a tungsten-silicide film and a polysilicon film containing impurities. However, the bit line 131 may be formed of: a monolayer film such as a polysilicon film containing impurities, a tungsten film, a molybdenum film, a titanium film, a platinum film, a tungsten-silicide film, a molybdenum-silicide film, a titanium-silicide film, or a platinum-silicide film; or a laminated film of a polysilicon film containing impurities and a molybdenum-silicide film, a titanium-silicide film, or a platinum-silicide film.

Furthermore, the charge-storage electrode 137 was formed of a polysilicon film containing impurities. However, the charge-storage electrode 137 may be formed of: a monolayer film such as a tungsten-silicide film, a molybdenum-silicide film, a titanium-silicide film, or a tungsten film, or a laminated film of a polysilicon film containing impurities, a platinum film, and a tantalum film.

The capacity insulating film 138 was formed of a laminated film of a silicon oxide film and a silicon nitride film. However, the capacity insulating film 138 may be formed of: a monolayer film such as a tantalum oxide film, a strontium titanate film, a strontium titanate film in which barium is added, a plumbum, zirconium, and titanium containing oxide (PZT) film, or a plumbum, lanthanum, zirconium, and titanium containing oxide (PLZT) film; or a laminated film of a tantalum oxide film and a silicon oxide film.

In addition, the plate electrode 139 was formed of a polysilicon film containing impurities. However, the plate electrode 139 may be formed of a titanium nitride film, a tungsten film, a tungsten-silicide film, a molybdenum film, a molybdenum-silicide film, or the like.

Embodiment 2

A semiconductor storage unit according to Embodiment 2 of the present invention and a method of manufacturing the same will be explained with reference to FIGS. 11–19 as follows. Each plan view in the FIGS. shows only important parts and the other parts are omitted therein.

In a process shown in FIG. 11, a first impurity-diffusion layer 203 is formed on a semiconductor substrate (a silicon substrate) 201 by ion implantation 202. The first impurity-diffusion layer 203 has a reverse conductive type as compared to that of the semiconductor substrate 201.

In a process shown in FIG. 12(b), a laminated film 205 of a silicon nitride film and a silicon oxide film is formed on the semiconductor substrate 204. A photoresist 206 formed by a mask pattern 207 is provided. FIG. 12(a) is a plan view of FIG. 12(b). As shown in FIG. 12(a), the mask pattern 207 is formed by combining two congruent figures that are not in contact with each other in a unit memory cell region. The combination of two congruent figures means a combination of mask patterns 207a and 207b or a combination of mask patterns 207b and 207c.

In a process shown in FIG. 13(a), a part of the laminated film 208 is removed by photoetching. Then, a part of the semiconductor substrate 210 is removed so as to form first openings 211 deeper than the impurity diffusion layer 209.

In a process shown in FIG. 13(b), using a photoresist 212, a second impurity-diffusion layer 215 is formed on the side walls and a part of the bottom face of specific first openings 214 by ion implantation 213. The second impurity-diffusion layer 215 has a reverse conductive type as compared to that of the semiconductor substrate 210.

In a process shown in FIG. 13(c), a CVD silicon oxide film 216 is deposited. In a process shown in FIG. 13(d), a part of the laminated film 208 and a part of the silicon oxide film 216 are removed by polishing to flatten the whole surface and to leave a filled-in film 219 within the first openings 218. In a process shown in FIG. 14(a), the whole laminated film 217 and a part of the filled-in film 219 are removed by wet etching to leave a part of the filled-in film 220 and to expose the surface 221 of the semiconductor substrate.

In processes shown in FIGS. 14(b) and (c), a photoresist 222 is used to remove a part of the filled-in film 223 by photoetching to form second openings 224. Subsequently, a third impurity-diffusion layer 245 having the same conductive type as that of the semiconductor substrate 210 is formed by ion implantation 246 so as to be deeper than the second impurity-diffusion layer 215. This enables the second impurity-diffusion layer 215 to be isolated by the third impurity-diffusion layer 245 securely. Then the photoresist 222 is removed.

In a process shown in FIG. 14(d), a gate oxide film 225 and a polysilicon film 226 containing impurities are formed sequentially. A gate electrode 227 is then formed by etchback in a process shown in FIG. 15(b). FIG. 15(a) shows a plan view of FIG. 15(b). In processes shown in FIGS. 16 (a) and (b), a CVD silicon oxide film 228 is deposited and flattened. Then, using a photoresist 229 a contact hole (a connection hole) 230 is formed by photoetching.

In processes shown in FIGS. 16(c) and (d), after depositing a polysilicon film 231 containing impurities, a charge-storage electrode 233 is formed by photoetching using a photoresist 232.

In a process shown in FIG. 17(b), a capacity insulating film 234 formed of a laminated film of a silicon oxide film and a silicon nitride film and a polysilicon film 235 containing impurities are formed sequentially. Then, a plate electrode 235 is formed by photoetching and an open region 236 also is formed. FIG. 17(a) is a plan view of FIG. 17(b).

In processes shown in FIGS. 18(a) and (b), a CVD silicon oxide film 237 is deposited and flattened, and then a contact hole (a connection hole) 239 is formed using a photoresist 238 by photoetching. In a process shown in FIG. 19(b), a bit line 240 is formed by photoetching. The bit line 240 is formed of a laminated film of a tungsten-silicide film and a polysilicon film containing impurities. FIG. 19(a) is a plan view of FIG. 19(b).

In a semiconductor storage unit manufactured by the processes described above, as shown in FIG. 19(b), the gate electrode 227 is formed within the second opening 224 formed in a specific region of the first opening 211 within the semiconductor substrate 210. Therefore, the gate electrode 227 is surrounded by and covered with the insulating film of the filled-in film 223 and the CVD silicon oxide film 228. Consequently, the short circuit between the gate electrode 227 and the other conductive layers does not occur easily, thus obtaining a highly reliable semiconductor storage unit.

The second impurity-diffusion layer 215 having a reverse conductive type as compared to that of the semiconductor substrate 210 is isolated by the third impurity-diffusion layer 245 having the same conductive type as that of the semiconductor substrate 210. Then, one of the isolated second impurity-diffusion layers 215 and a first impurity-diffusion layer 209 connected thereto can be used as a source, and the other second impurity-diffusion layer 215 and a first impurity-diffusion layer 209 connected thereto can be used as a drain.

Furthermore, the formation of the third impurity-diffusion layer 245 as described above enables reliable threshold voltage control of a switching transistor of a memory cell. That is to say, even in the case of miniaturizing a semiconductor storage unit, when the second impurity-diffusion layer 215 is isolated by the third impurity-diffusion layer 245 and these isolated second impurity-diffusion layers 215 are used as a source and a drain as described above, the on-off control of the switching transistor can be performed at the gate electrodes.

In the present embodiment, the second impurity-diffusion layer 215 is isolated by forming the third impurity-diffusion layer 245. However, the third impurity-diffusion layer 245 may not be formed when the second impurity-diffusion layer 215 is formed by the ion implantation 213 to be isolated in advance in the process shown in FIG. 13(b). This method is effective in the case where the gate electrode is relatively long and there is a sufficient space between the source and the drain.

Figure 12:
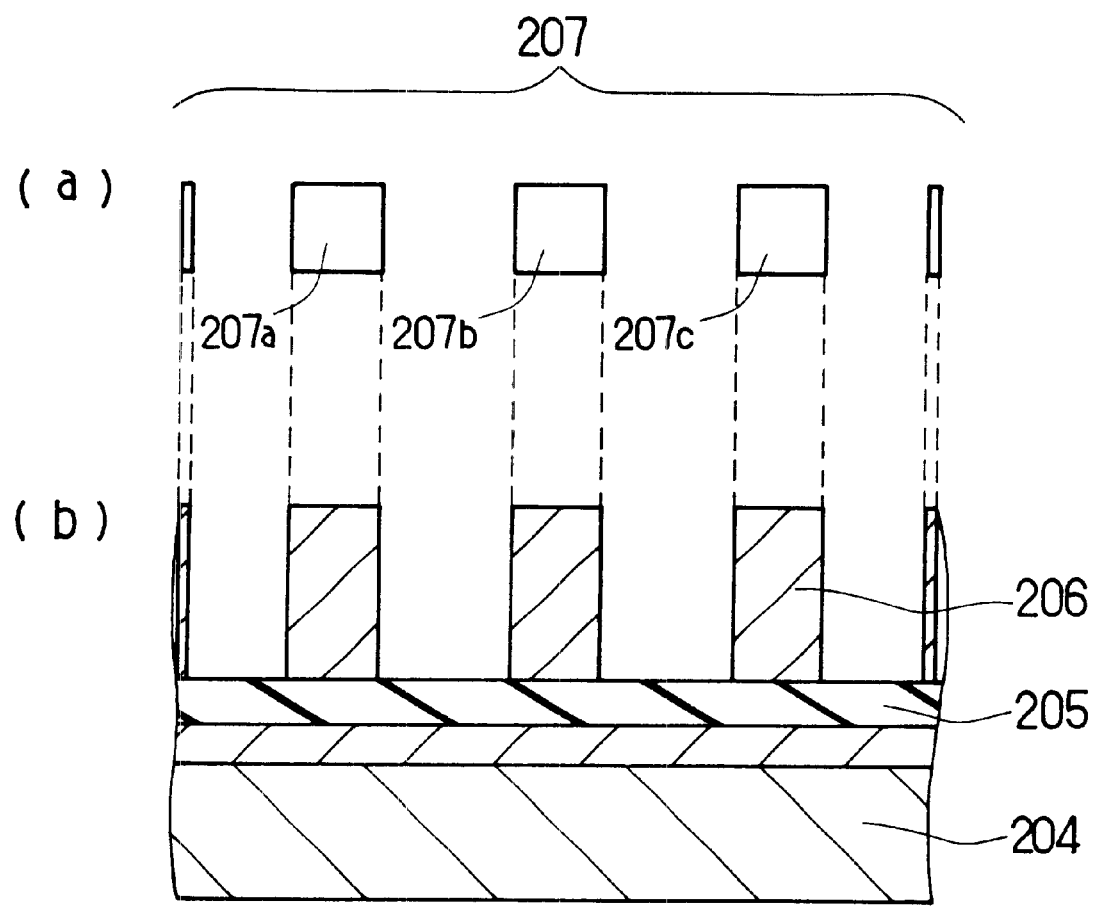
Figure 13:
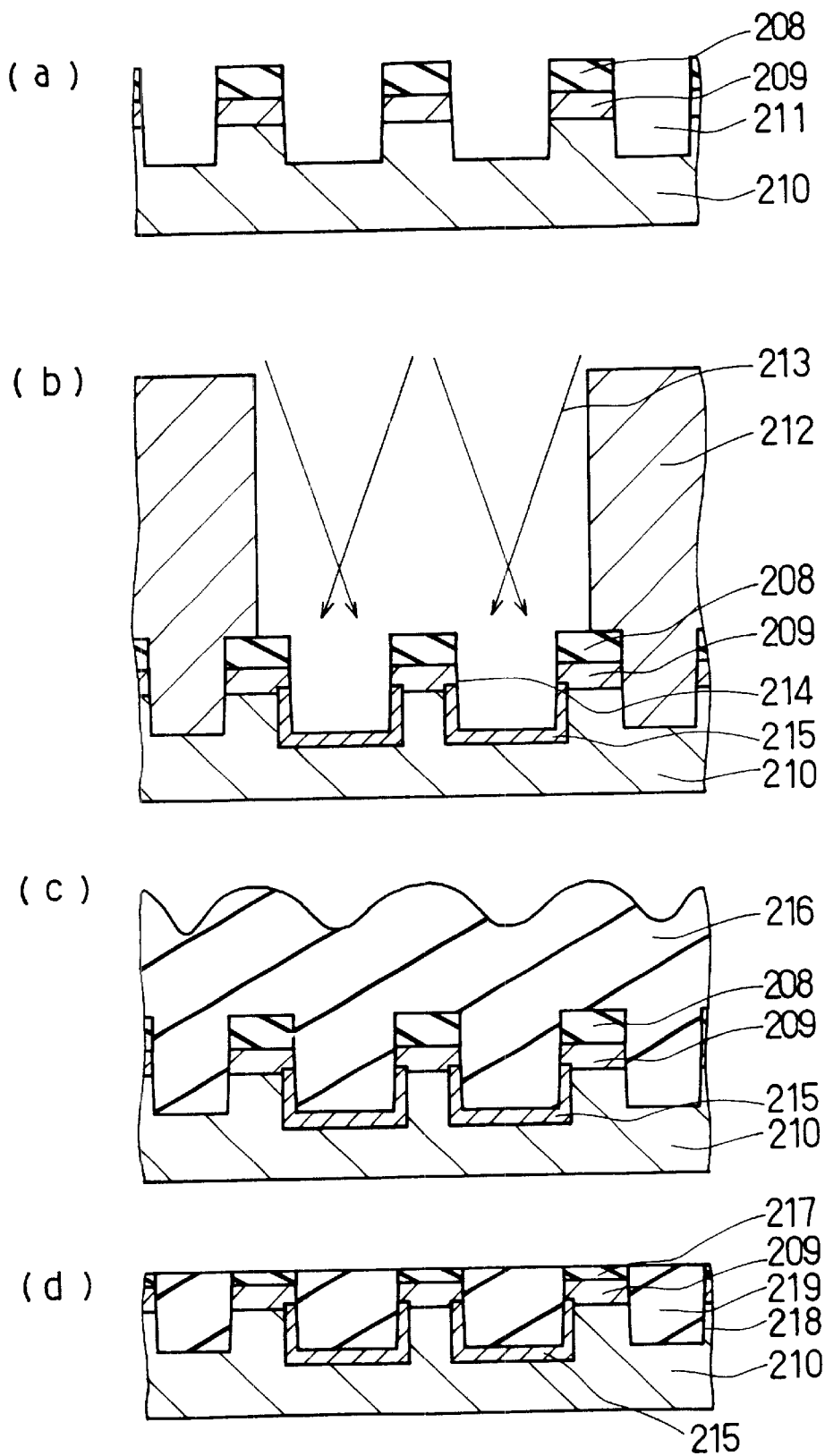
Figure 14:
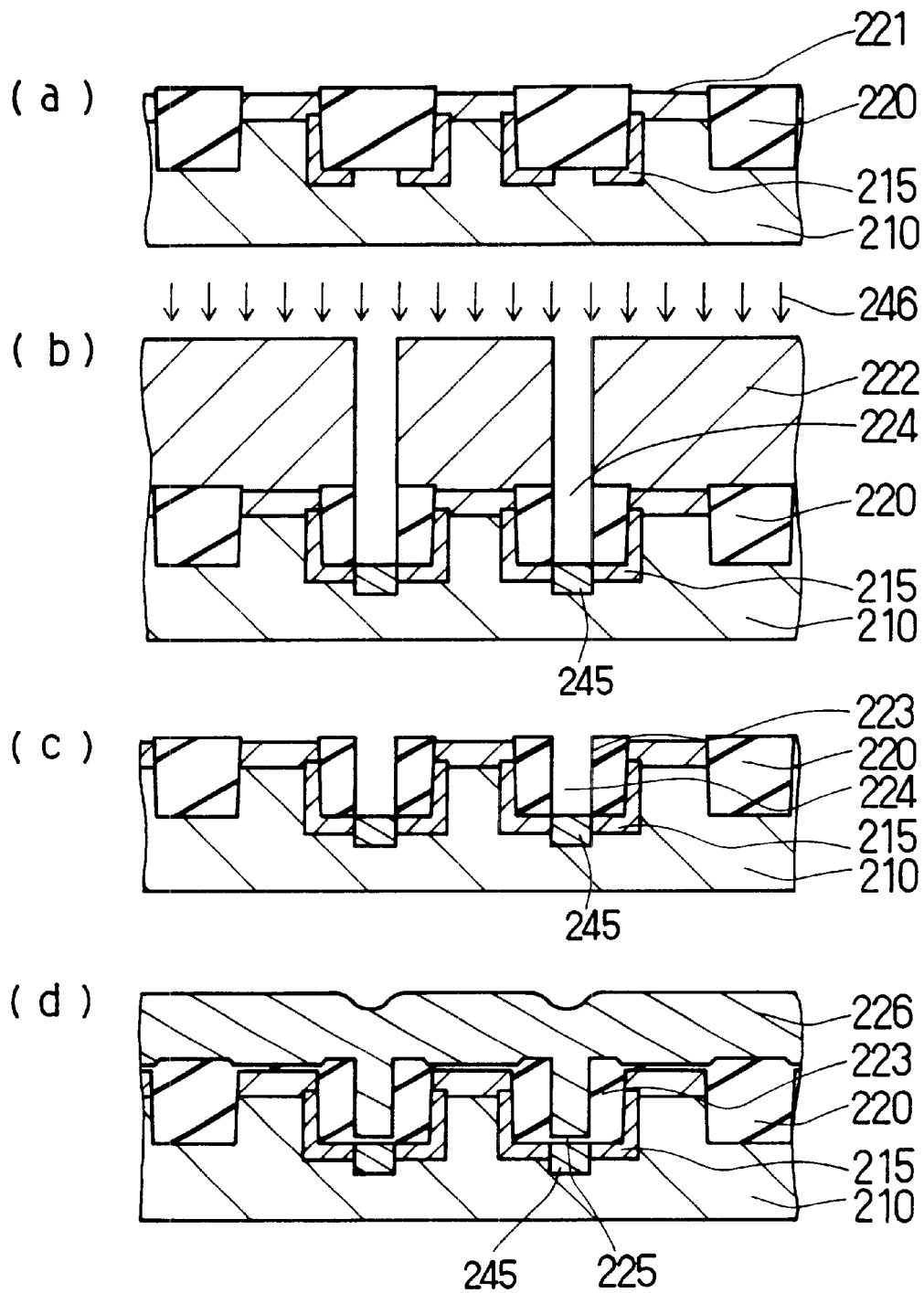

Unit memory cells (active regions) 241 and 242 and isolation regions 243 and 244 between adjacent memory cells shown in FIG. 19(b) are specified by forming the first openings 211 using the mask pattern 207 (see FIG. 12) with simple figures. By forming the second opening 224, the region of the gate electrode 227 is specified. In addition, the regions 223 covering the gate electrode 227 and insulating the gate electrode 227 from the other conductive layers are formed. Consequently, the manufacturing processes are simplified and the number of manufacturing processes is reduced, thus reducing manufacturing costs. In addition, as shown in FIG. 12(a), the mask pattern 207 is formed by combining two congruent figures that are not in contact with each other in a unit memory cell region. Therefore, compared to the case using the mask pattern 107 having different lengths longitudinally as an example, the unit memory cell region can be made small, thus enabling the higher integration.

Figure 17:
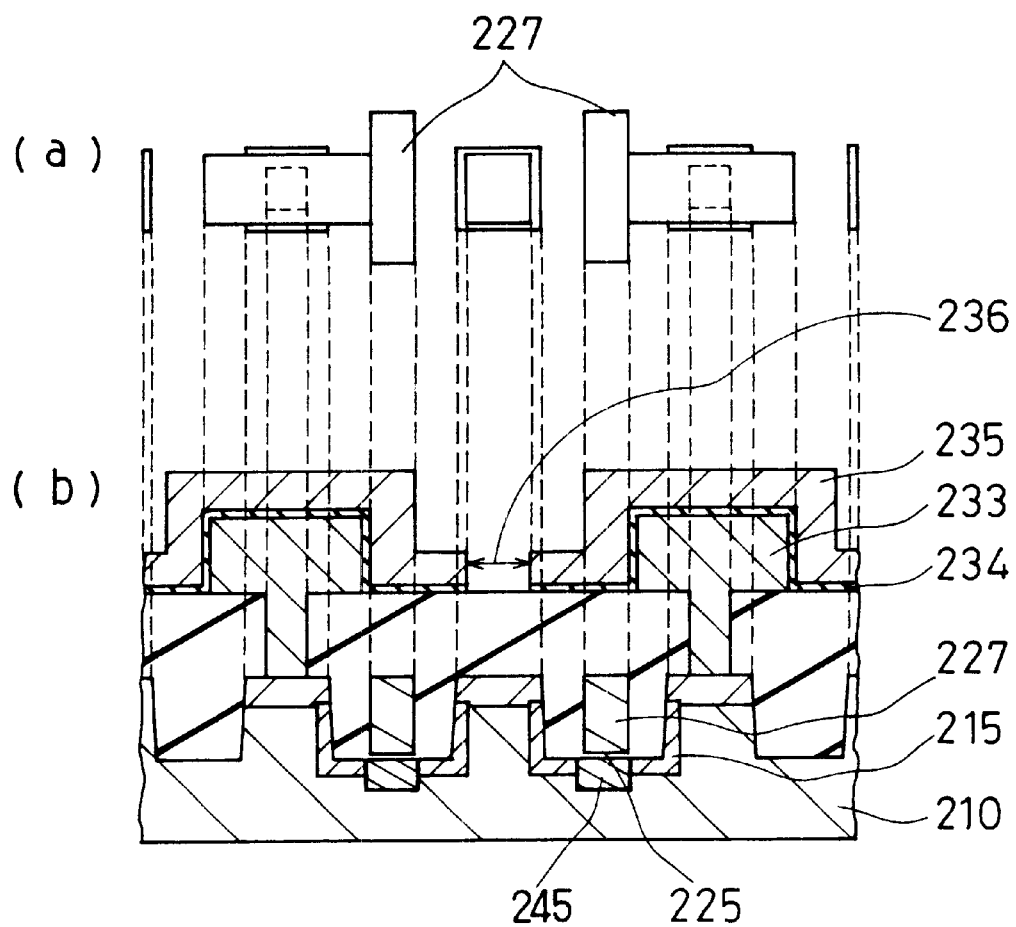

Further, as shown in FIG. 19(b), the contact hole 239 for connecting the bit line 240 and the semiconductor substrate 201 passes through the plate electrode 235. The contact hole 239 is insulated from the plate electrode 235 by the CVD silicon oxide films 228 and 239. In this case, as shown in FIG. 17, a mask having the open region 236 is used in patterning the plate electrode 235.

As shown in FIGS. 18(a) and (b), after depositing the CVD silicon oxide film 237 of an insulating film, the CVD silicon oxide film 237 fills the opening region 236. Then, since the connection hole 239 is formed using such a mask as to have an opening pattern with a smaller size than that of the opening region 236, the CVD oxide film 237 is left between the opening region 236 of the plate electrode 235 and the connection hole 239. Thus, the insulation between the plate electrode 235 and the bit line 240 can be secured even if a material for the bit line 240 is filled in the connection hole 239.

In addition to the use of such a mask pattern, the active regions 241 and 242 and the element-insulation regions 243 and 244 are formed using the mask pattern 207 as shown in FIG. 12, so that the impurity-diffusion layer regions 209 of an active region are located on the same line as shown in FIG. 19(b). Consequently, the memory cell region can be secured in a small area, thus obtaining a highly integrated semiconductor storage unit.

In Embodiment 2, the gate electrode 227 was formed of a polysilicon film containing impurities. However, the gate electrode 227 may be formed of: a monolayer film such as a tungsten film, a molybdenum film, a titanium film, a platinum film, a tungsten-silicide film, a molybdenum-silicide film, a titanium-silicide film, or a platinum-silicide film; or a laminated film of a polysilicon film containing impurities and a tungsten-silicide film, a molybdenum-silicide film, a titanium-silicide film, or a platinum-silicide film.

The charge-storage electrode 233 was formed of a polysilicon film containing impurities. However, the charge-storage electrode 233 may be formed of: a monolayer film such as a tungsten-silicide film, a molybdenum-silicide film, a titanium-silicide film, or a tungsten film; or a laminated film of a polysilicon film containing impurities, a platinum film, and a tantalum film.

The capacity insulating film 234 was formed of a laminated film of a silicon oxide film and a silicon nitride film. However, the capacity insulating film 234 may be formed of a monolayer film such as a tantalum oxide film, a strontium titanate film, a strontium titanate film in which barium is added, a plumbum, zirconium, and titanium containing oxide (PZT) film, or a plumbum, lanthanum, zirconium, and titanium containing oxide (PLZT) film; or a laminated film of a tantalum oxide film and a silicon oxide film.

In addition, the plate electrode 235 was formed of a polysilicon film containing impurities. However, the plate electrode 235 may be formed of a titanium nitride film, a tungsten film, a tungsten-silicide film, a molybdenum film, a molybdenum-silicide film, or the like.

Further, the bit line 240 was formed of a laminated film of a tungsten-silicide film and a polysilicon film containing impurities. However, the bit line 240 may be formed of: a monolayer film such as a polysilicon film containing impurities, a tungsten film, a molybdenum film, a titanium film, a platinum film, a tungsten-silicide film, a molybdenum-silicide film, a titanium-silicide film, or a platinum-silicide film; or a laminated film of a polysilicon film containing impurities and a molybdenum-silicide film, a titanium-silicide film, or a platinum-silicide film.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a semiconductor storage unit comprising:
    forming a first impurity-diffusion layer on a semiconductor substrate, the first impurity-diffusion layer having a reverse conductive type as compared to that of the semiconductor substrate;
    forming a first insulating film on the semiconductor substrate and then a plurality of first openings by partially removing the first insulating film and the semiconductor substrate;
    filling the first openings with a second insulating film by depositing the second insulating film on the semiconductor substrate;
    forming a filled-in layer in the first openings by removing a part of the first and the second insulating film by polishing to flatten a whole surface while leaving the second insulating film in the first openings;
    forming second openings by partially removing the filled-in layer in specific first openings selected from the plurality of first openings by photoetching;
    depositing a third insulating film in the second openings and a first conductive film on the semiconductor substrate sequentially; and
    forming a gate electrode within the second opening via the third insulating film by leaving the first conductive film in the second openings.

2. The method of manufacturing a semiconductor storage unit according to claim 1,
    wherein after forming the gate electrode the method farther comprises: depositing a fourth insulating film on the semiconductor substrate, flattening the fourth insulating film, and then forming a first connection hole in the fourth insulating film, the first connecting hole reaching the surface of the semiconductor substrate;
    depositing a second conductive film on the semiconductor substrate and then forming a bit line;
    depositing a fifth insulating film on the semiconductor substrate, flattening the fifth insulating film, an then forming a second connection hole in the fifth insulating film, the second connection hole reaching the surface of the semiconductor substrate; and
    depositing a third conductive film on the semiconductor substrate and then forming a charge-storage electrode.

3. The method of manufacturing a semiconductor storage unit according to claim 2,
    wherein after forming the charge-storage electrode, the method further comprises depositing a capacity insulating film and a fourth conductive film sequentially and then forming a plate electrode.

4. The method of manufacturing a semiconductor storage unit according to claim 1,
    wherein the first openings are formed using a mask pattern formed by combining two figures that are not in contact with each other in an active region of a unit memory cell.

5. The method of manufacturing a semiconductor storage unit according to claim 1,
    wherein the first openings are formed using a mask pattern formed by combining two congruent figures that are not in contact with each other in an active region of a unit memory cell.

6. The method of manufacturing a semiconductor storage unit according to claim 1, wherein after forming the gate electrode the method farther comprises:

depositing a fourth insulating film on the semiconductor substrate, flattening the forth insulating film, and then forming a first connection hole in the fourth insulating film, the first connection hole reaching the surface of the semiconductor substrate;

depositing a second conductive film on the semiconductor substrate and then forming a charge-storage electrode;

depositing a capacity insulating film and a third conductive film on the semiconductor substrate and then forming a plate electrode;

depositing a fifth insulating film on the semiconductor substrate, flattening the fifth insulating film, and then forming a second connection hole in the fifth insulating film, the second connection hole reaching the surface of the semiconductor substrate; and depositing a fourth conductive film on the semiconductor substrate and then forming a bit line.

7. The method of manufacturing a semiconductor storage unit according to claim 1, wherein the method further comprises:

after forming the first openings and before forming the filled-in layer, forming a second impurity-diffusion layer having a reverse conductive type as compared to that of the semiconductor substrate in the first openings.

8. The method of manufacturing a semiconductor storage unit according to claim 7, wherein the method further comprises:

after forming the second openings and before forming the third insulating film, forming a third impurity-diffusion layer having the same conductive type as that of the semiconductor substrate in the first openings, with the third impurity-diffusion layer isolating the second impurity-diffusion layer.

9. The method of manufacturing a semiconductor storage unit according to claim 8, wherein a depth of the third impurity-diffusion layer is deeper than that of the second impurity-diffusion layer.

10. The method of manufacturing a semiconductor storage unit according to claims 7, wherein the second impurity-diffusion layers are formed by ion implantation at an implantation angle of less than 90° with respective to the surface of the semiconductor substrate.

11. The method of manufacturing a semiconductor storage unit according to claim 1, wherein a depth of the first opening is deeper than that of the first impurity-diffusion layer.

12. The method of manufacturing a semiconductor storage unit according to claim 7, wherein the second openings are formed so that the depth of the second opening measured from the surface of the semiconductor substrate is equal to or deeper than that of the first opening measured from the surface of the semiconductor substrate and is shallower than that of the second impurity-diffusion layer at the bottom of the second opening measured from the surface of the semiconductor substrate.

13. The method of manufacturing a semiconductor storage unit according to claim 1, wherein the first openings are formed by photoetching.

14. The method of manufacturing a semiconductor storage unit according to claim 2, wherein the first connection hole, the bit line, the second connection hole, and the charge storage electrode are each formed by photoetching.

15. The method of manufacturing a semiconductor storage unit according to claim 3, wherein the plate electrode is formed by photoetching.

16. The method of manufacturing a semiconductor storage unit according to claim 6, wherein the first connection hole, the charge storage electrode, the plate electrode, the second connection hole, and the bit line are each formed by photoetching.

* * * * *